United States Patent
Saito

(10) Patent No.: US 7,372,100 B2
(45) Date of Patent: May 13, 2008

(54) SEMICONDUCTOR DEVICE

(75) Inventor: Wataru Saito, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/563,483

(22) Filed: Nov. 27, 2006

(65) Prior Publication Data
US 2007/0132012 A1     Jun. 14, 2007

(30) Foreign Application Priority Data
Nov. 30, 2005   (JP) .............................. 2005-345169

(51) Int. Cl.
*H01L 29/76*   (2006.01)
(52) U.S. Cl. .............................. 257/329; 257/E29.027; 257/E29.262
(58) Field of Classification Search ................ 257/329, 257/E29.027, E29.262
See application file for complete search history.

(56) References Cited

U.S. PATENT DOCUMENTS

| | | | |
|---|---|---|---|
| 5,216,275 A | | 6/1993 | Chen |
| 6,081,009 A | | 6/2000 | Neilson |
| 6,693,338 B2 | | 2/2004 | Saitoh et al. |
| 6,849,880 B1 * | | 2/2005 | Saito et al. .................. 257/135 |
| 6,919,610 B2 | | 7/2005 | Saitoh et al. |
| 2001/0052601 A1 * | | 12/2001 | Onishi et al. ................ 257/138 |
| 2002/0063259 A1 * | | 5/2002 | Usui et al. ................... 257/110 |
| 2005/0082570 A1 | | 4/2005 | Sridevan |
| 2005/0133859 A1 | | 6/2005 | Kuwahara et al. |
| 2005/0250322 A1 * | | 11/2005 | Aida et al. .................. 438/672 |
| 2006/0284248 A1 * | | 12/2006 | Saito et al. .................. 257/341 |

FOREIGN PATENT DOCUMENTS

| JP | 2005-142557 | 6/2005 |
|---|---|---|
| JP | 2005-203565 | 7/2005 |

* cited by examiner

*Primary Examiner*—Trung Dang
(74) *Attorney, Agent, or Firm*—Oblon, Spivak, McClelland, Maier & Neustadt, P.C.

(57) ABSTRACT

A semiconductor device includes: a semiconductor layer of a first conductivity type; a plurality of first cylindrical semiconductor pillar regions of the first conductivity type periodically provided on a major surface of the semiconductor layer; a plurality of second cylindrical semiconductor pillar regions of a second conductivity type provided on the major surface of the semiconductor layer and being adjacent to the first semiconductor pillar regions; a plurality of first semiconductor regions of the second conductivity type provided in contact with the top of the second semiconductor pillar regions; second semiconductor regions of the first conductivity type selectively provided on the surface of the first semiconductor regions; a first main electrode provided on the first semiconductor region and the second semiconductor region; an insulating film provided on the first semiconductor pillar regions, the first semiconductor regions, and the second semiconductor regions; a control electrode provided on the insulating film; and a second main electrode provided on a side opposite to the major surface of the semiconductor layer. The control electrode has openings periodically provided in first and second directions substantially parallel to the insulating film. Each of the first semiconductor regions is provided below the opening of the control electrode. A period of arrangement of the plurality of second cylindrical semiconductor pillar regions is smaller than the periods of the openings in the first and second directions.

20 Claims, 18 Drawing Sheets

SEMICONDUCTOR DEVICE

CROSS-REFERENCE TO RELATED APPLICATIONS

This application is based upon and claims the benefit of priority from the prior Japanese Patent Application No.2005-345169, filed on Nov. 30, 2005; the entire contents of which are incorporated herein by reference.

BACKGROUND OF THE INVENTION

1. Field of the Invention

This invention relates to a semiconductor device, and more particularly to a semiconductor device having the superjunction structure.

2. Background Art

Vertical MOSFETs (Metal Oxide Semiconductor Field Effect Transistors) suitable for power electronics application have been conventionally known. The on-resistance of this MOSFET greatly depends on the electric resistance of the conduction layer (drift layer). The resistance can be decreased by increasing the impurity concentration of the drift layer. However, the increase of impurity concentration is restricted for ensuring a desired breakdown voltage. That is, there is a tradeoff between the device breakdown voltage and the on-resistance. Improving this tradeoff is important for low power consumption devices.

As an example MOSFET improving the tradeoff, a MOSFET having a structure called the superjunction structure is known, where p-type pillar regions and n-type pillar regions are provided in parallel in the drift layer. See, e.g., U.S. Pat. No. 6,081,009 (FIG. 3). In this structure, a non-doped layer is artificially produced by equalizing the amount of impurities contained in the p-type pillar region and the n-type pillar region. While maintaining high breakdown voltage, a current is allowed to flow through the n-type pillar region doped with high concentration. Thus a device with low on-resistance over the limit of the material is realized.

In this superjunction structure, the period of the superjunction structure (the period of repetition of the p-type pillar region and the n-type pillar region) needs to be decreased for increasing the amount of impurities in the p-type and n-type pillar region to reduce the on-resistance. If the amount of impurities in the p-type and n-type pillar region is increased without decreasing the period, the lateral electric field for completely depleting the superjunction structure is increased, and the vertical electric field determining the breakdown voltage is decreased. Thus the period of the superjunction structure needs to be decreased for reducing the on-resistance while maintaining high breakdown voltage.

When the superjunction structure is arranged in the same direction and at the same period as the overlying MOS gate structure, decreasing the period of the superjunction structure entails downsizing of the MOS gate structure. The downsizing of the MOS gate structure leads to a significant change of process and a decrease in process margin.

The '009 patent also discloses the superjunction structure and the MOS gate structure extending orthogonal to each other in a striped configuration. In such configuration, the period of the superjunction structure can be made different from the period of the MOS gate structure.

However, in such configuration, electrons injected from the channel into the n-type pillar region spread and flow below the base region. This lateral spreading resistance causes a problem of increased on-resistance.

SUMMARY OF THE INVENTION

According to an aspect of the invention, there is provided a semiconductor device including: a semiconductor layer of a first conductivity type; a plurality of first cylindrical semiconductor pillar regions of the first conductivity type periodically provided on a major surface of the semiconductor layer; a plurality of second cylindrical semiconductor pillar regions of a second conductivity type provided on the major surface of the semiconductor layer and being adjacent to the first semiconductor pillar regions; a plurality of first semiconductor regions of the second conductivity type provided in contact with the top of the second semiconductor pillar regions; second semiconductor regions of the first conductivity type selectively provided on the surface of the first semiconductor regions; a first main electrode provided on the first semiconductor region and the second semiconductor region; an insulating film provided on the first semiconductor pillar regions, the first semiconductor regions, and the second semiconductor regions; a control electrode provided on the insulating film; and a second main electrode provided on a side opposite to the major surface of the semiconductor layer, the control electrode having openings periodically provided in first and second directions substantially parallel to the insulating film, each of the first semiconductor regions being provided below the opening of the control electrode, and a period of arrangement of the plurality of second cylindrical semiconductor pillar regions being smaller than the periods of the openings in the first and second directions.

According to other aspect of the invention, there is provided a semiconductor device including: a semiconductor layer of a first conductivity type; a plurality of first cylindrical semiconductor pillar regions of the first conductivity type periodically provided on a major surface of the semiconductor layer; a plurality of second cylindrical semiconductor pillar regions of a second conductivity type provided on the major surface of the semiconductor layer and being adjacent to the first semiconductor pillar regions; a plurality of first semiconductor regions of the second conductivity type provided in contact with the top of the second semiconductor pillar regions; second semiconductor regions of the first conductivity type selectively provided on the surface of the first semiconductor regions; a first main electrode provided on the first semiconductor region and the second semiconductor region; an insulating film provided on the first semiconductor pillar regions, the first semiconductor regions, and the second semiconductor regions; a control electrode provided on the insulating film; and a second main electrode provided on a side opposite to the major surface of the semiconductor layer, the first semiconductor regions being periodically provided in first and second directions substantially parallel to the insulating film, and a period of arrangement of the plurality of second cylindrical semiconductor pillar regions being smaller than the periods of the first semiconductor regions in the first and second directions.

DETAILED DESCRIPTION OF THE INVENTION

First, a description is given of a comparative example that was investigated by the inventor in the process of reaching the invention.

Figure 3:
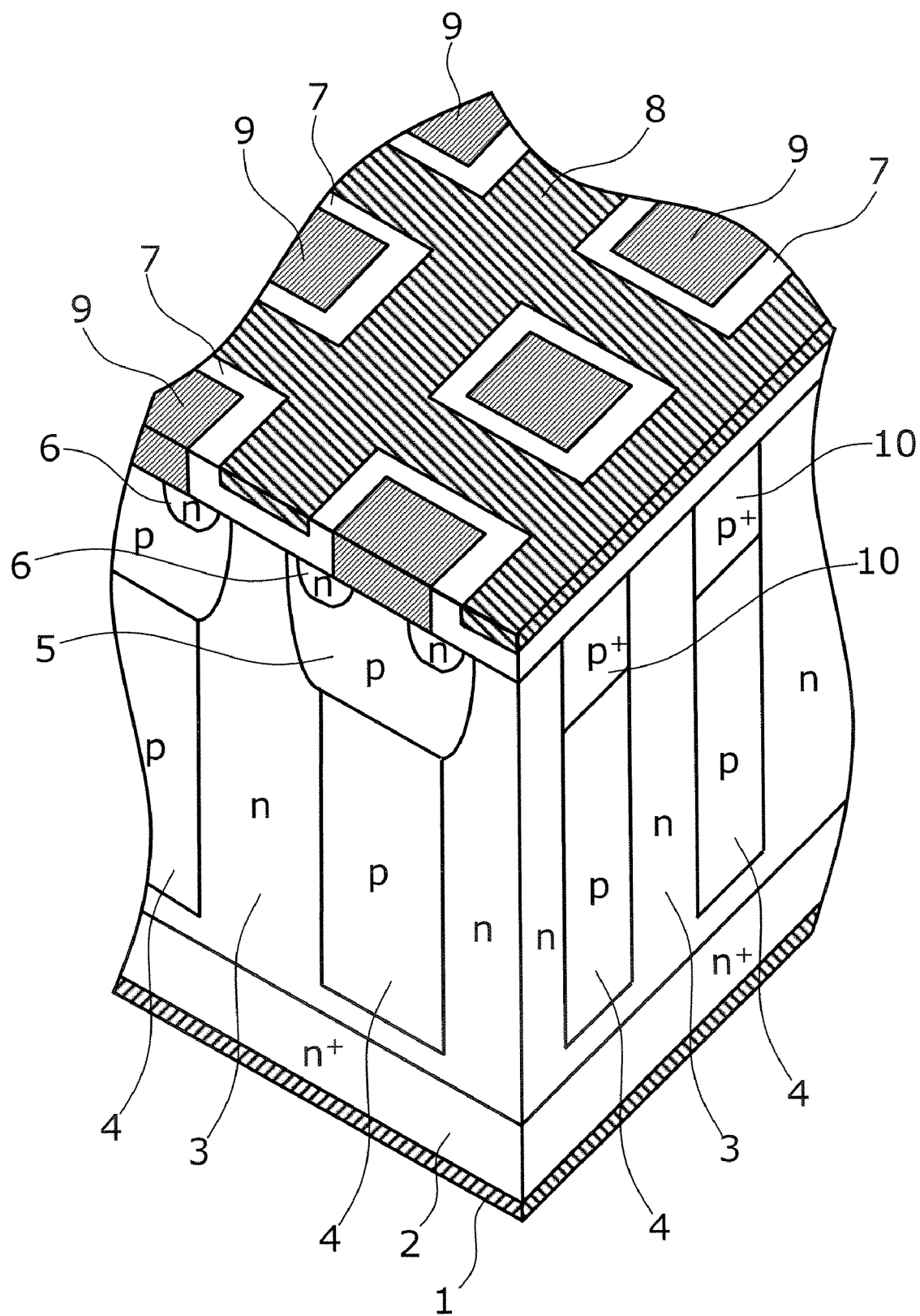
FIG. 3 is a schematic perspective view illustrating the cross-sectional and planar structure of the relevant part of a semiconductor device according to a second embodiment of the invention.
Figure 18:
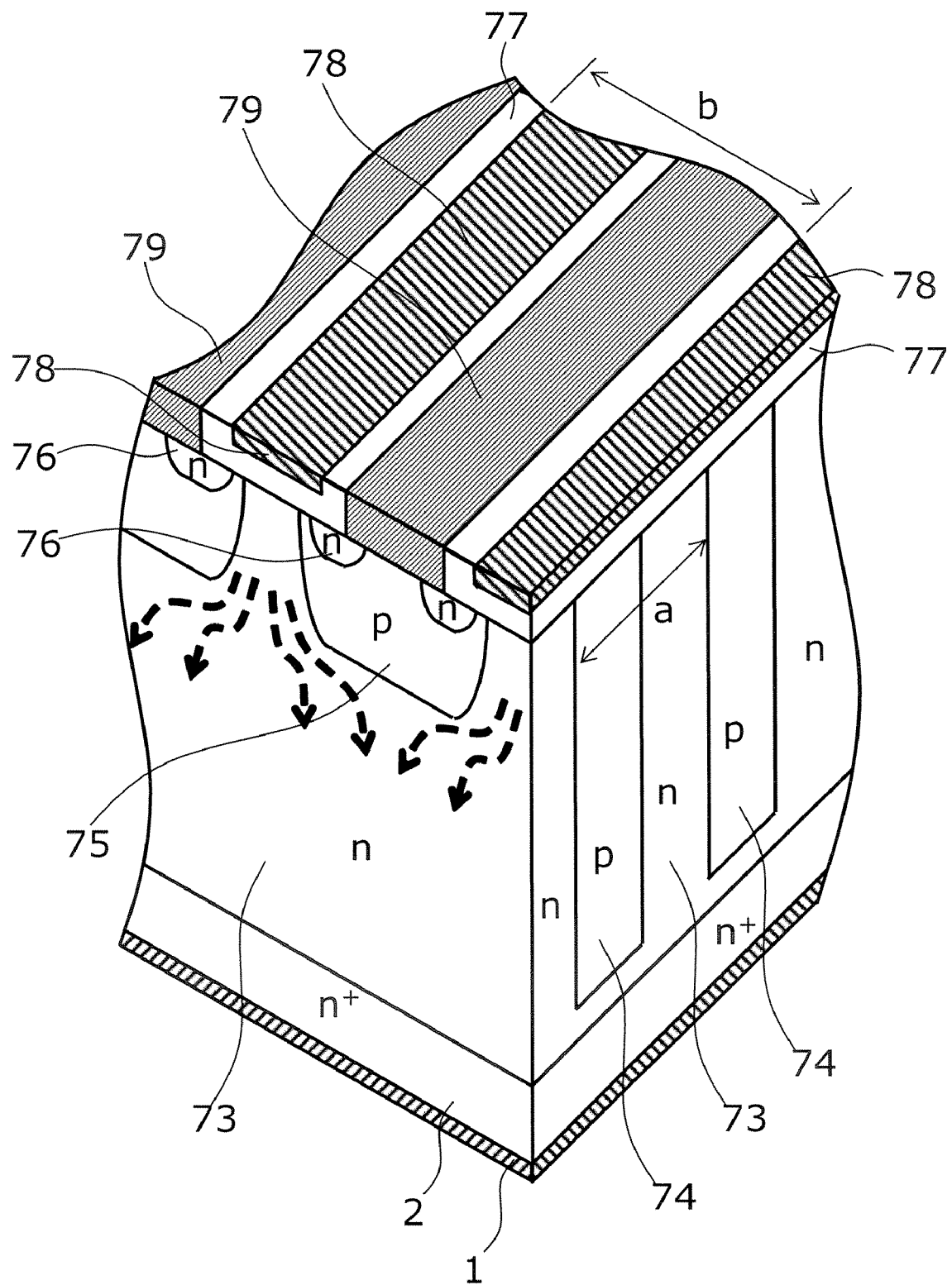
FIG. 18 is a schematic perspective view illustrating the cross-sectional and planar structure of the relevant part of a semiconductor device of a comparative example.

FIG. 18 is a schematic perspective view illustrating the cross-sectional and planar structure of the relevant part of a semiconductor device of the comparative example. A similar structure is disclosed in the '009 patent (FIG. 3).

This semiconductor device comprises an n-type semiconductor layer 2, an n-type pillar region 73 provided on a major surface of the semiconductor layer 2, a p-type pillar region 74 provided on the major surface of the semiconductor layer 2 so as to be adjacent to the n-type pillar region 73, a p-type base region 75 provided in contact with the top portion of the p-type pillar region 74, an n-type source region 76 selectively provided on the surface of the base region 75, a source electrode 79 provided on the base region 75 and the source region 76, an insulating film 77 provided on the n-type pillar region 73, the base region 75, and the source region 76, a control electrode 78 provided on the insulating film 77, and a drain electrode 1 provided on the side opposite to the major surface of the semiconductor layer 2.

By forming the superjunction structure and the MOS gate structure that extend orthogonal to each other in a striped configuration, the period a of the superjunction structure can be made different from the period b of the MOS gate structure.

However, in such configuration, as indicated by dashed arrows in FIG. 18, electrons injected from the channel into the n-type pillar region 73 spread and flow below the base region 75. This lateral spreading resistance causes a problem of increased on-resistance.

Embodiments of the invention will now be described with reference to the drawings. The following embodiments are described assuming the first conductivity type as n-type and the second conductivity type as p-type.

First Embodiment

Figure 1:
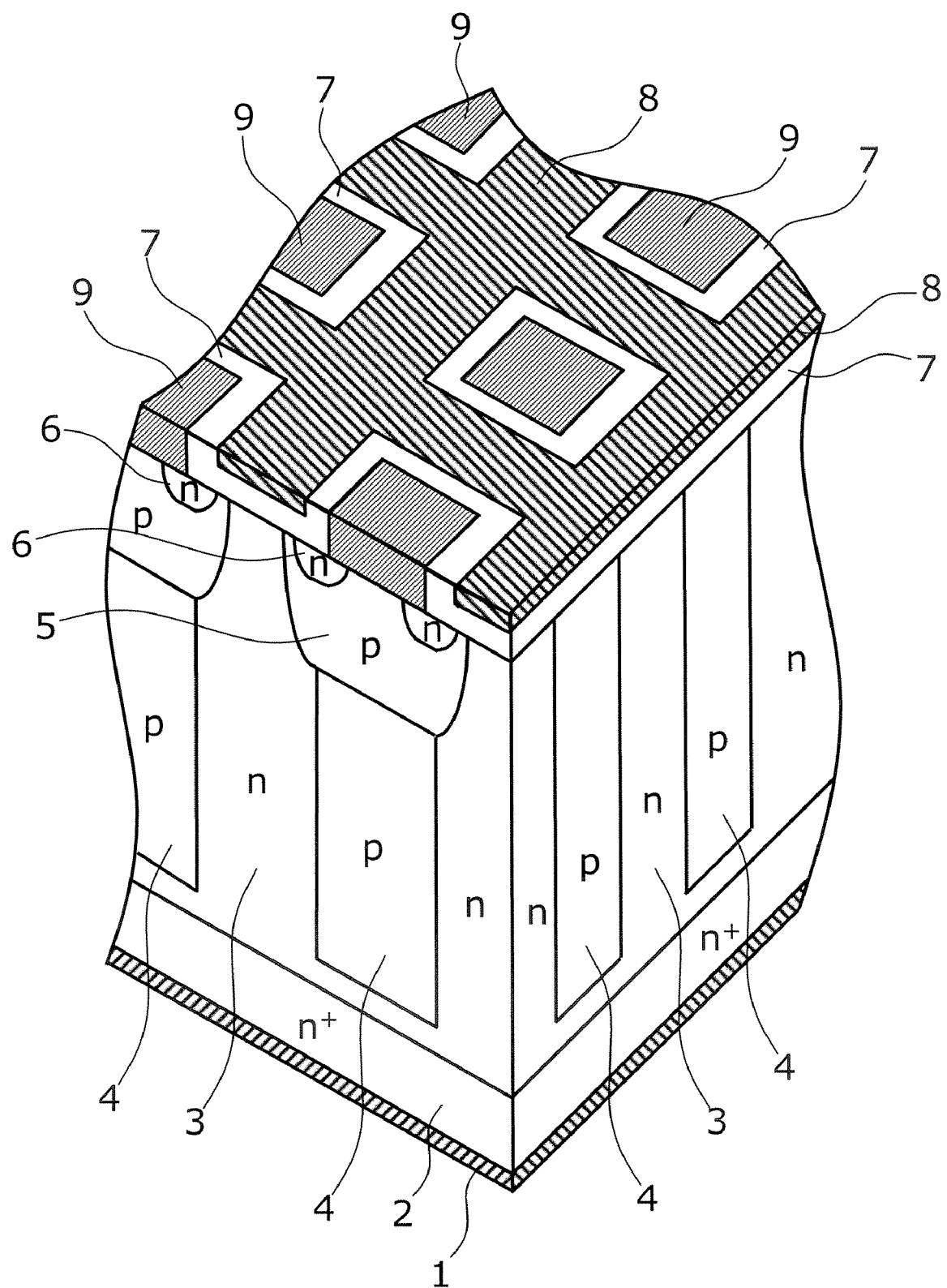
FIG. 1 is a schematic perspective view illustrating the cross-sectional and planar structure of the relevant part of a semiconductor device according to a first embodiment of the invention.

FIG. 1 is a schematic perspective view illustrating the cross-sectional and planar structure of the relevant part of a semiconductor device according to a first embodiment of the invention.

Figure 2:
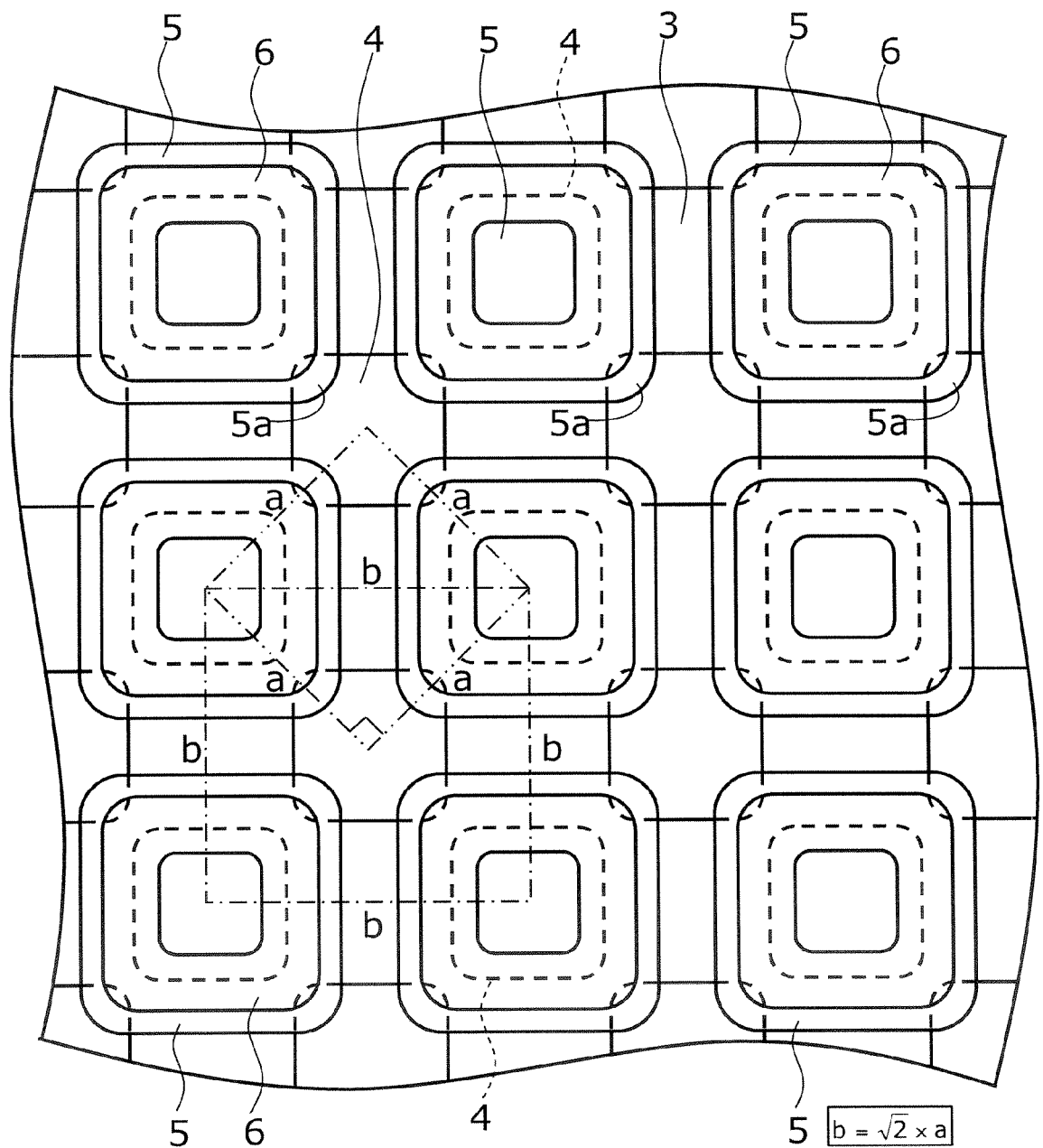
FIG. 2 is a schematic plan view illustrating the positional relationship between the base region and the p-type pillar region in the semiconductor device according to the first embodiment.

FIG. 2 is a schematic plan view illustrating the positional relationship between the base region 5 and the p-type pillar region 4 in the semiconductor device.

On a major surface of an $n^+$-type silicon semiconductor layer 2 having high impurity concentration, first pillar regions 3 of n-type silicon (hereinafter also simply referred to as "n-type pillar regions") and second pillar regions 4 of p-type silicon (hereinafter also simply referred to as "p-type pillar regions") are provided. A drain electrode (second main electrode) 1 is provided on the side opposite to the major surface of the semiconductor layer 2.

The p-type pillar region 4 has a cylindrical shape extending substantially perpendicular to the major surface of the semiconductor layer 2. For example, the p-type pillar region 4 has a rectangular cylindrical shape with its corners rounded as shown in FIG. 2. Note that the p-type pillar region 4 is not limited to the shape shown in the figure, but may have a circular cylindrical shape, for example. Furthermore, while the bottom of the p-type pillar region 4 does not reach the semiconductor layer 2, the p-type pillar region 4 may be provided so as to reach the semiconductor layer 2. The periphery (side face) of the p-type pillar region 4 is surrounded by the n-type pillar regions 3. That is, the n-type pillar region 3 is in contact with the p-type pillar region 4 to form a pn-junction.

A plurality of cylindrical p-type pillar regions 4 are arranged periodically. If the four p-type pillar regions 4 each centered on a vertex of the square indicated by the double-dot dashed line in FIG. 2 are taken as a unit, for example, a base region 5 of p-type silicon is provided in a planar configuration on the two p-type pillar regions 4 opposed to each other. The planar configuration of the base region 5 exhibits a rectangular shape having four rounded corners 5a as shown in FIG. 2. As with the p-type pillar region 4, the base region 5 is also in contact with the n-type pillar region 3 to form a pn-junction.

The base region 5 is provided on two of the four p-type pillar regions 4 arranged periodically. Thus the base regions 5 are also arranged periodically. Furthermore, the p-type pillar regions 4 have a higher arrangement density than the base regions 5. That is, the p-type pillar regions 4 have a smaller repetition period than the base regions 5.

In addition to directly below the base region 5, the p-type pillar region 4 is also provided in a portion which is faced by the corners 5a of the four adjacent base regions 5. The top portion of the four corners of the p-type pillar region 4 provided in this portion is in contact with a corner 5a of one of the four surrounding base regions 5. The top portion of the p-type pillar region 4 provided directly below the base region 5 is in contact with the bottom of the base region 5.

A source region 6 of $n^+$-type silicon is provided selectively (for example, in a ring configuration as shown in FIG. 2) on the surface of the base region 5. Note that in this embodiment, the base region 5 corresponds to the first semiconductor region, and the source region 6 corresponds to the second semiconductor region.

As shown in FIG. 1, a source electrode 9 serving as a first main electrode is provided on the base region 5 inside the source region 6 and on part of the inner peripheral portion of the source region 6. The source region 6 is electrically connected to the source electrode 9.

An insulating film 7 is provided on the portion extending from the n-type pillar region 3 via the base region 5 to the source region 6. The insulating film 7 is a silicon oxide film, for example, and has a film thickness of about 0.1 micrometer. Note that the insulating film 7 collectively refers to a gate insulating film formed on the channel (the surface of the base region 5 between the n-type pillar region 3 and the source region 6) and an interlayer insulating film between the gate electrode (control electrode) and the source electrode.

A control electrode 8 is provided on the insulating film 7 and spaced apart from the source electrode 9. The control electrode 8 extends along the contour of the base region 5 and has openings periodically provided in a first and second direction on the insulating film 7. That is, in this embodiment, the control electrode 8 is spread in a lattice configuration. The base region 5 is provided below the opening of the control electrode 8. The p-type pillar region 4 provided in the portion faced by the corners 5a of the four adjacent base regions 5 is located below the crossing of the control electrode 8.

In this embodiment, the period of the so-called superjunction structure having repetitions of the n-type pillar region 3 and the p-type pillar region 4 is smaller than the repetition period of the MOS gate structure provided on the superjunction structure. That is, the p-type pillar regions 4 are provided in a cylindrical configuration surrounded by the n-type pillar regions 3 and are arranged more densely than the p-type base regions 5.

The pitch between the adjacent p-type pillar regions 4 equals a as indicated by the double-dot dashed line in FIG. 2. That is, the period of the superjunction structure equals a. On the other hand, the pitch between the adjacent base regions 5 equals b as indicated by the dot dashed line in FIG. 2. That is, the period of the MOS gate structure equals b.

According to this embodiment, the cylindrical configuration of the p-type pillar regions 4 and the island configuration of the base regions 5 increase the flexibility of their layout. By providing the p-type pillar regions 4 at positions other than directly below the base regions 5, the period a of the superjunction structure can be exclusively decreased without decreasing the period b of the MOS gate structure.

With regard to the relation between a and b, it is clear from FIG. 2 that b is the hypotenuse of a right isosceles triangle having two sides equal to a. Therefore the relation $b=\sqrt{2}\times a$ holds. That is, the period a of the superjunction structure is $1/\sqrt{2}$ times the period b of the MOS gate structure.

As compared with the situation where the period of the superjunction structure equals the period b of the MOS gate structure (hereinafter referred to as a second comparative example), this embodiment can decrease the period a of the superjunction structure by a factor of $\sqrt{2}$. In general, the superjunction structure is designed so that [impurity concentration]×[period] is constant for achieving the desired breakdown voltage. Therefore, if the period can be decreased by a factor of $\sqrt{2}$, the impurity concentration can be increased by a factor of $\sqrt{2}$, and thereby the on-resistance can be decreased by a factor of $\sqrt{2}$. To achieve this, there is no need to downsize the MOS gate structure. Thus it is possible to avoid the change of process and the decrease in process margin such as shallowing the base region 5 and narrowing the spacing between the control electrode 8 and the source electrode 9. It is also possible to avoid the tendency of electric field concentration due to an increased curvature at the corner of the base region caused by shallowing the base region 5. Thus the breakdown voltage can be prevented from decreasing.

Furthermore, in contrast to the first comparative example described above with reference to FIG. 18, in this embodiment the cylindrical p-type pillar regions 4 are provided directly below the base regions 5 and arranged in the n-type pillar region 3 in a zigzag configuration, thereby restricting the lateral spreading of the n-type pillar region 3. Thus electrons injected from the channel into the n-type pillar region 3 are prevented from laterally spreading in the n-type pillar region 3 below the base region 5. This also contributes to decreasing the on-resistance.

Moreover, because a p-type pillar region 4 is provided at the corner 5a of the base region 5 below the crossing of the control electrode 8 formed in a lattice configuration, it is possible to alleviate electric field concentration onto the corner 5a of the base region 5 and to facilitate achieving high breakdown voltage.

There is no particular limitation to the method of forming the superjunction structure. For example, it is possible to use the method of conducting a plurality of iterations of ion implantation and epitaxial growth, the method of forming a trench in a semiconductor layer of the first conductivity type followed by buried growth of a semiconductor layer of the second conductivity type in the trench, or the method of forming a trench followed by ion implantation into the trench sidewall.

The MOS gate structure can be formed by a common process of forming a MOS structure. For example, after a control electrode 8 is formed via an insulating film 7 on the superjunction structure, the control electrode 8 is used as a mask for ion implantation to form a base region 5 in a self-aligned manner. Then a source region 9 is selectively formed on the surface of the base region 5.

The structure of this embodiment can be obtained simply by adapting the reticle pattern of the p-type pillar region 4 and the control electrode 8 to this embodiment without causing any change in the process. Therefore the process throughput is left unchanged, causing no decrease of manufacturing yield.

In the following, other embodiments of the invention are described. Elements similar to those described previously are marked with the same reference numerals and not described in detail.

Second Embodiment

FIG. 3 is a schematic perspective view illustrating the cross-sectional and planar structure of the relevant part of a semiconductor device according to a second embodiment of the invention.

Figure 4:
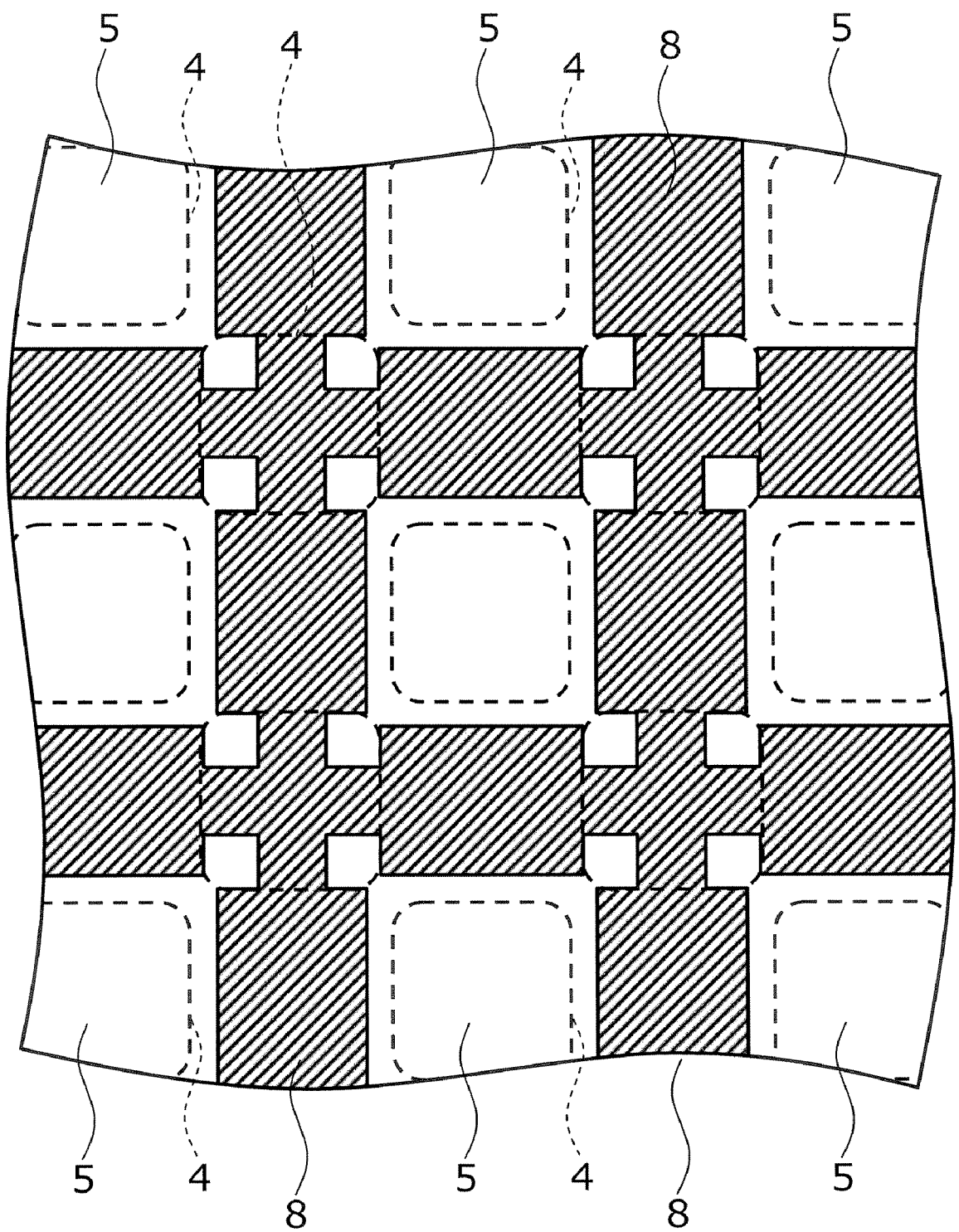
FIG. 4 is a schematic plan view illustrating a pattern of the control electrode in the semiconductor device according to the second embodiment

FIG. 4 is a schematic plan view illustrating a pattern of the control electrode in the semiconductor device according to the second embodiment.

The second embodiment is different from the first embodiment in that a p-type high-concentration region 10 having a higher impurity concentration than the p-type pillar region 4 is provided on the surface of the p-type pillar region 4 provided at the corner 5a of the base region 5 that is located below the crossing of the control electrode 8. This structure further alleviates electric field concentration onto the corner 5a of the base region 5 and facilitates achieving high breakdown voltage. Because there is no need to deplete the high-concentration region 10, the high-concentration region 10 and the base region 5 preferably have a comparable impurity concentration. While the high-concentration region 10 and the base region 5 have a comparable depth in FIG. 3, the high-concentration region 10 may be deeper than the base region 5. The high-concentration region 10 may have a high concentration than the base region 5.

This structure can be obtained as follows. The line width of the control electrode 8, which also serves as a mask for forming the base region 5, is decreased only at the crossing as shown in FIG. 4. Then ion implantation of p-type impurities is conducted. In a subsequent heat treatment step, the p-type impurities are diffused into the surface of the p-type pillar region 4, thereby completing the structure. Alternatively, the high-concentration region 10 may be formed by conducting ion implantation into the surface of the p-type pillar region 4 before forming the MOS structure.

Third Embodiment

Figure 5:
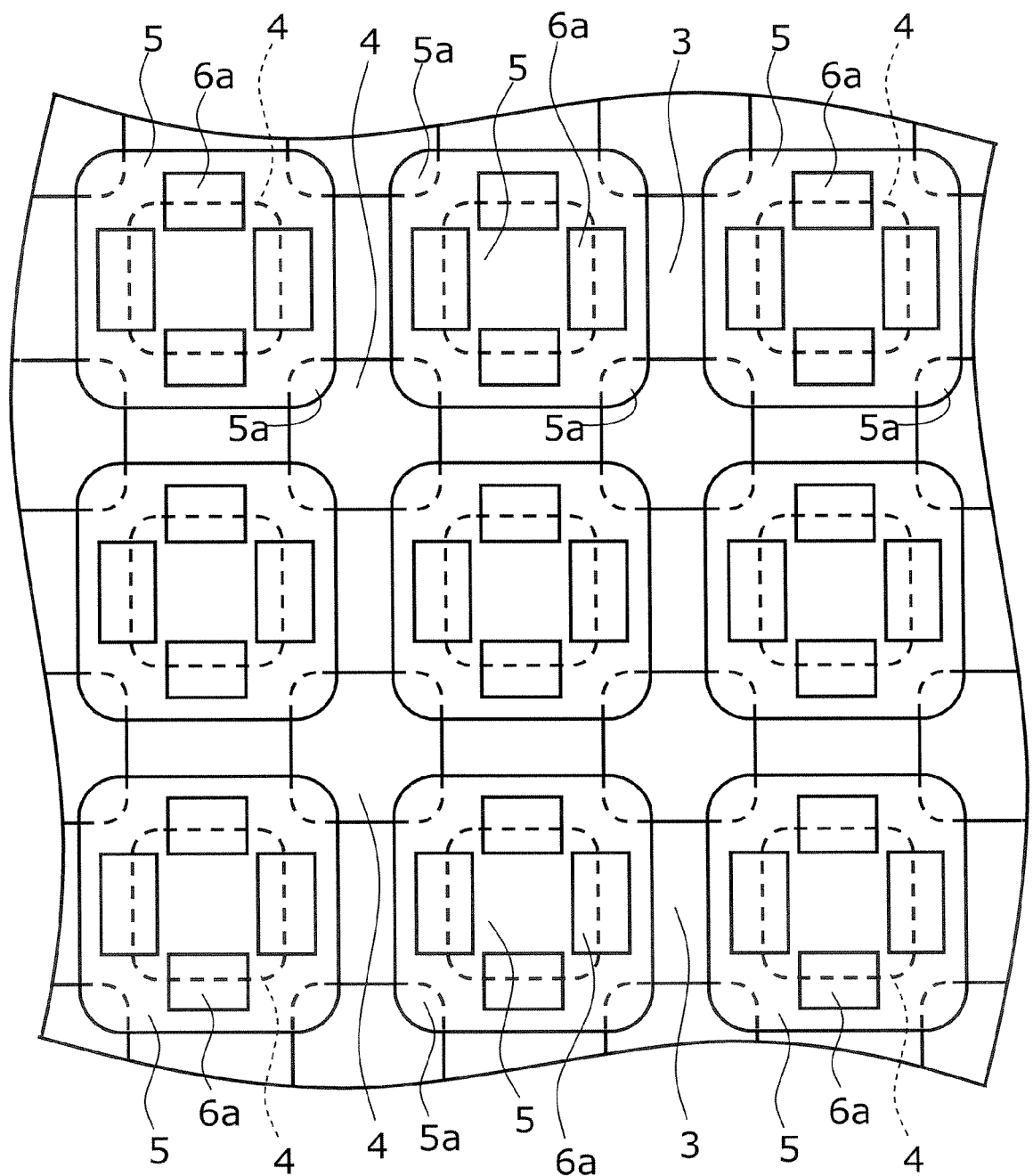
FIG. 5 is a schematic plan view illustrating a pattern of the source region in a semiconductor device according to a third embodiment of the invention.

FIG. 5 is a schematic plan view illustrating a pattern of the source region 6a in a semiconductor device according to a third embodiment of the invention.

In this embodiment, the source regions 6a are provided only at positions opposed to the four sides of the base region 5, and not provided at positions opposed to the corners 5a. Because a p-type pillar region 4 is provided in contact with a corner 5a of the base region 5, the corner 5a does not constitute the current path. Therefore the on-resistance is not changed even if no source region is provided at the corner 5a of the base region 5.

Thus the source region 6a is not formed at the corner 5a where electric field concentration is likely to occur and avalanche current is likely to flow. This prevents the operation of the parasite bipolar transistor composed of the source region 6a, the base region 5, and the n-type pillar region 3, thereby advantageously achieving high avalanche withstand capability.

Fourth Embodiment

Figure 6:
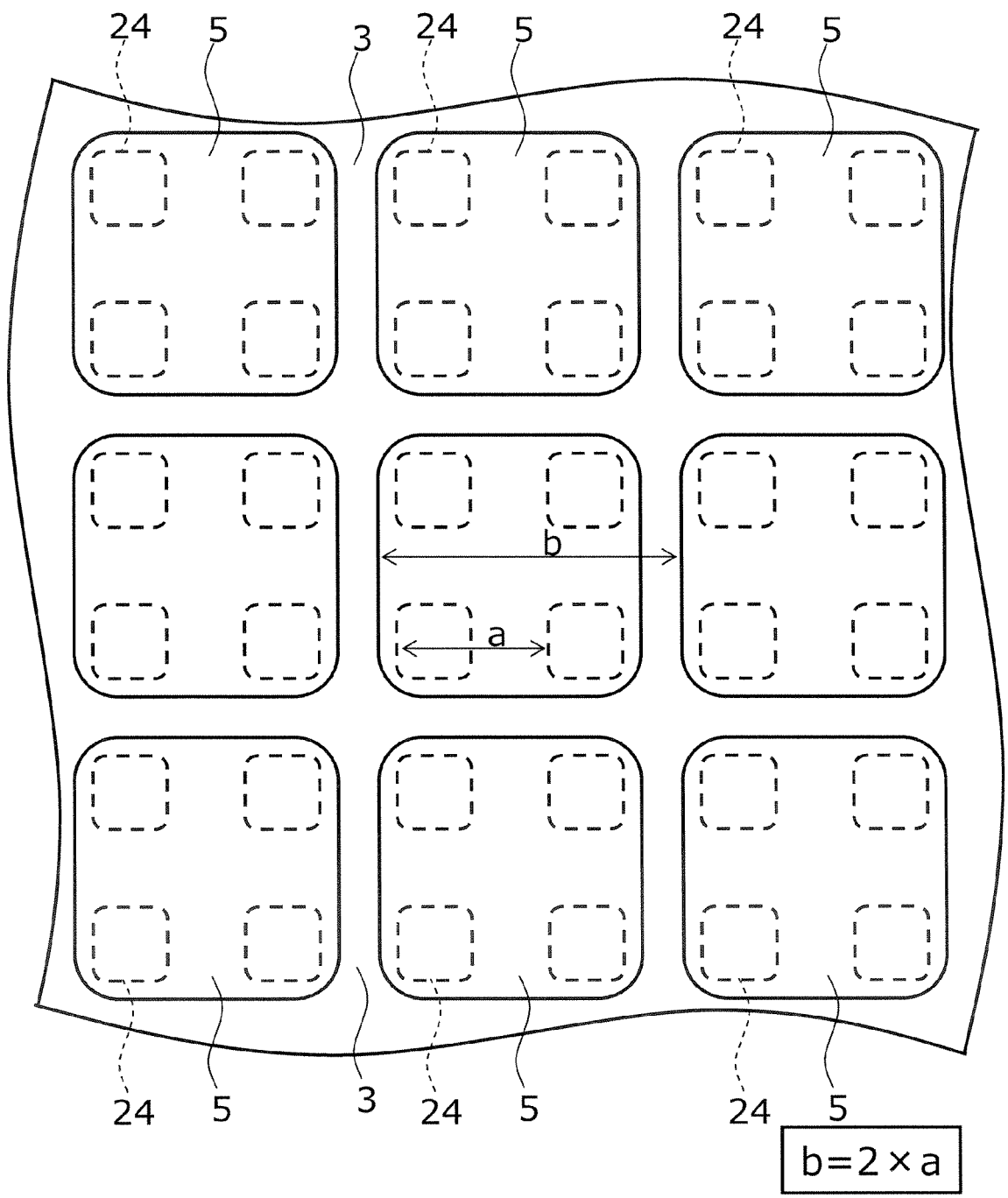
FIG. 6 is a schematic plan view illustrating the positional relationship between the base region and the p-type pillar region in a semiconductor device according to a fourth embodiment of the invention.

FIG. 6 is a schematic plan view illustrating the positional relationship between the base region 5 and the p-type pillar region 24 in a semiconductor device according to a fourth embodiment of the invention.

In this embodiment, like the first embodiment, the control electrode 8 is formed in a lattice configuration, and rectangular base regions 5 are provided in the cells of the lattice. Four p-type pillar regions 24 are provided below one base region 5. Each of the four p-type pillar regions 24 is placed in the vicinity of a corner of one base region 5.

The base regions 5 are spaced equidistantly in the two orthogonal directions (vertical and horizontal). Likewise, the p-type pillar regions 24 are also spaced equidistantly in the two orthogonal directions (vertical and horizontal). Therefore, as compared with the situation where the period of the superjunction structure equals the period b of the MOS gate structure, the period a of the superjunction structure is decreased by a factor of 2. As a result, the impurity concentration of the pillar region can be increased by a factor of 2, and the on-resistance can be decreased by a factor of 2.

Fifth Embodiment

Figure 7:
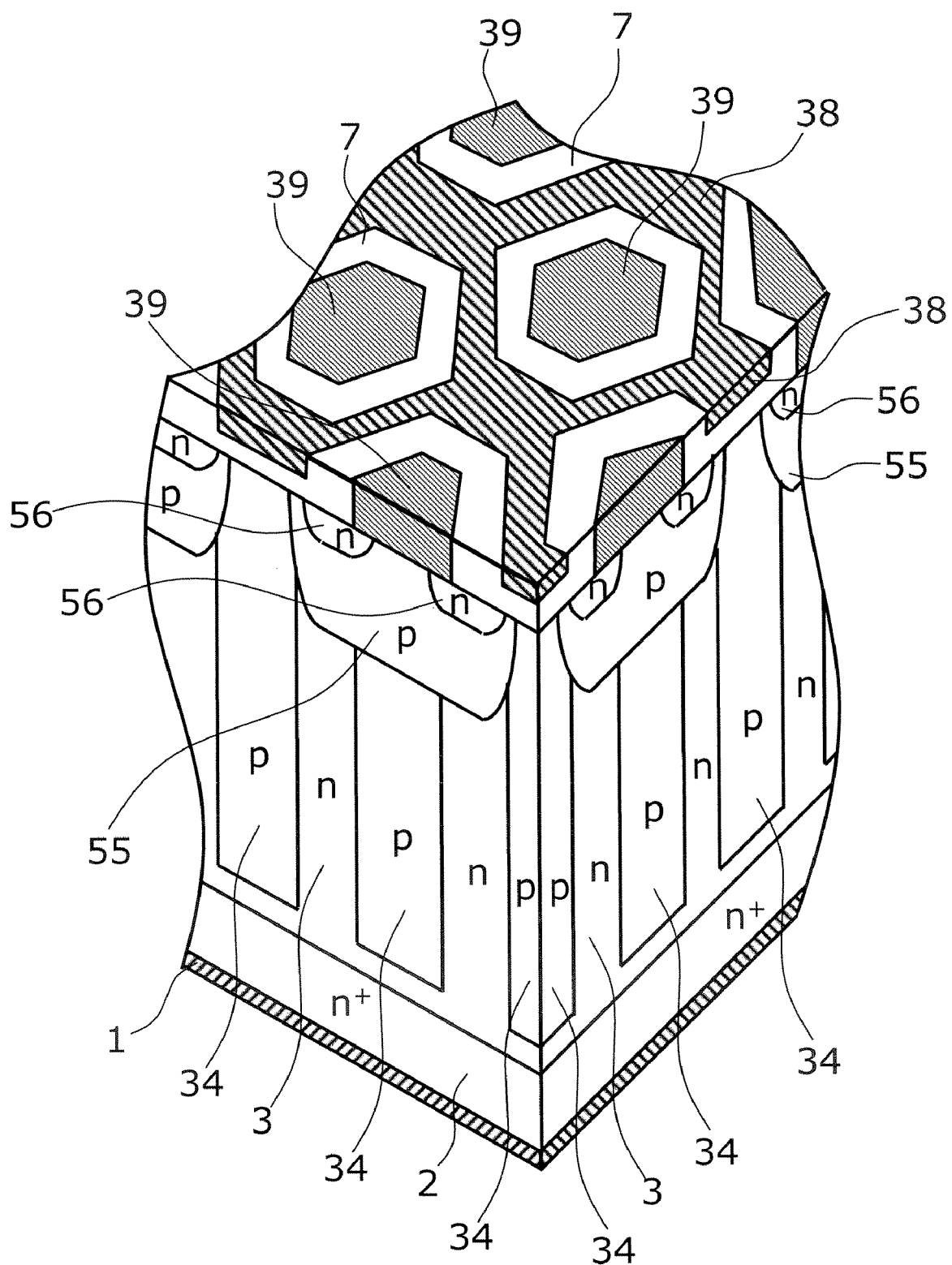
FIG. 7 is a schematic perspective view illustrating the cross-sectional and planar structure of the relevant part of a semiconductor device according to a fifth embodiment of the invention.

FIG. 7 is a schematic perspective view illustrating the cross-sectional and planar structure of the relevant part of a semiconductor device according to a fifth embodiment of the invention.

Figure 8:
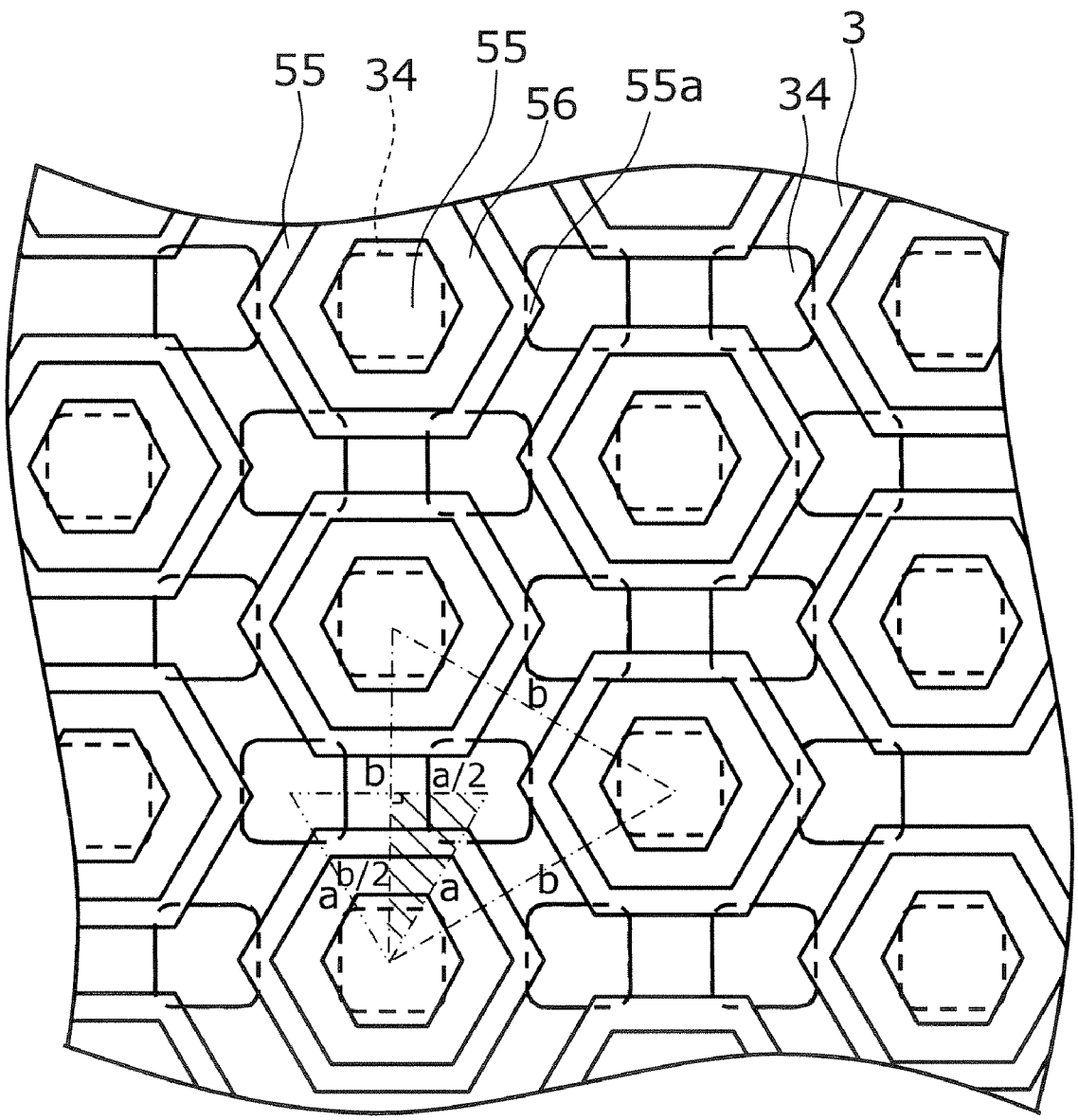
FIG. 8 is a schematic plan view illustrating the positional relationship between the base region and the p-type pillar region in the semiconductor device according to the fifth embodiment.

FIG. 8 is a schematic plan view illustrating the positional relationship between the p-type base region and the p-type pillar region in the semiconductor device according to the fifth embodiment.

In this embodiment, the planar configuration of the base region (first semiconductor region) 55 of p-type silicon exhibits a regular hexagonal shape as shown in FIG. 8. As compared with the rectangular base region 5 in the foregoing embodiments, the regular hexagonal base regions 55 can be provided more densely.

Like the first embodiment, the p-type pillar region 34 has a cylindrical shape surrounded by the n-type pillar regions 3. In addition to the portion directly below the base region 55, the p-type pillar region 34 is also provided in a portion which is faced by the corners (vertices) 55a of the three adjacent base regions 55. The top portion of the p-type pillar region 34 provided in this portion is in contact with the corners 55a of the three surrounding base regions 55. The top portion of the p-type pillar region 34 provided directly below the base region 55 is in contact with the bottom of the base region 55.

The base regions 55 and the p-type pillar regions 34 are both arranged periodically, and the p-type pillar regions 34 have a higher arrangement density than the base regions 55. That is, the p-type pillar regions 34 have a smaller repetition period than the base regions 55.

On the surface of the base region 55, a source region (second semiconductor region) 56 of $n^+$-type silicon is provided in a hexagonal ring configuration along the contour of the base region 55. The source region 56, and a source electrode 39 serving as a first main electrode and provided on the base region 55, also have a hexagonal planar configuration like the base region 55.

An insulating film 7 is provided on the portion extending from the n-type pillar region 3 via the base region 55 to the source region 56. A control electrode 38 is provided on the insulating film 7 and spaced apart from the source electrode 39. The control electrode 38 extends along the contour of the base region 55 and has openings periodically provided in a first and second direction on the insulating film 7. The base region 55 is provided below the opening of the control electrode 38. The p-type pillar region 34 provided in the portion faced by the corners 55a of the three adjacent base regions 55 is located below the crossing of the control electrode 38.

The pitch between the adjacent p-type pillar regions 34 equals a as indicated by the double-dot dashed line in FIG. 8. That is, the period of the superjunction structure equals a. On the other hand, the pitch between the adjacent base regions 55 equals b as indicated by the dot dashed line in FIG. 8. That is, the period of the MOS gate structure equals b.

According to this embodiment again, the cylindrical configuration of the p-type pillar regions 34 and the island configuration of the base regions 55 increase the flexibility of their layout. By providing the p-type pillar regions 34 at positions other than directly below the base regions 55, the period a of the superjunction structure can be exclusively decreased without decreasing the period b of the MOS gate structure.

Considering a regular triangle having angles of 30° and 60° hatched in FIG. 8, the ratio of sides of this regular triangle dictates that the relation $b=\sqrt{3} \times a$ holds. That is, the period a of the superjunction structure is $1/\sqrt{3}$ times the period b of the MOS gate structure.

As compared with the situation where the period of the superjunction structure equals the period b of the MOS gate structure, the period a of the superjunction structure can be decreased by a factor of $\sqrt{3}$. Therefore the impurity concentration can be increased by a factor of $\sqrt{3}$, and the on-resistance can be decreased by a factor of $\sqrt{3}$. To achieve this, there is no need to downsize the MOS gate structure. Thus it is possible to avoid the change of process and the decrease in process margin such as shallowing the base region and narrowing the spacing between the control electrode and the source electrode.

Furthermore, like the first embodiment, the cylindrical p-type pillar regions 34 are provided directly below the base regions 55 and arranged in the n-type pillar region 3 in a zigzag configuration, thereby restricting the lateral spreading of the n-type pillar region 3. Thus electrons injected from the channel into the n-type pillar region 3 are prevented from laterally spreading in the n-type pillar region 3 below the base region 55. This also contributes to decreasing the on-resistance.

Moreover, because a p-type pillar region 34 is provided at the corner 55a of the base region 55 below the crossing of the control electrode 38 having periodic openings, it is possible to alleviate electric field concentration onto the corner 55a of the base region 55 and to facilitate achieving high breakdown voltage.

Sixth Embodiment

Figure 9:
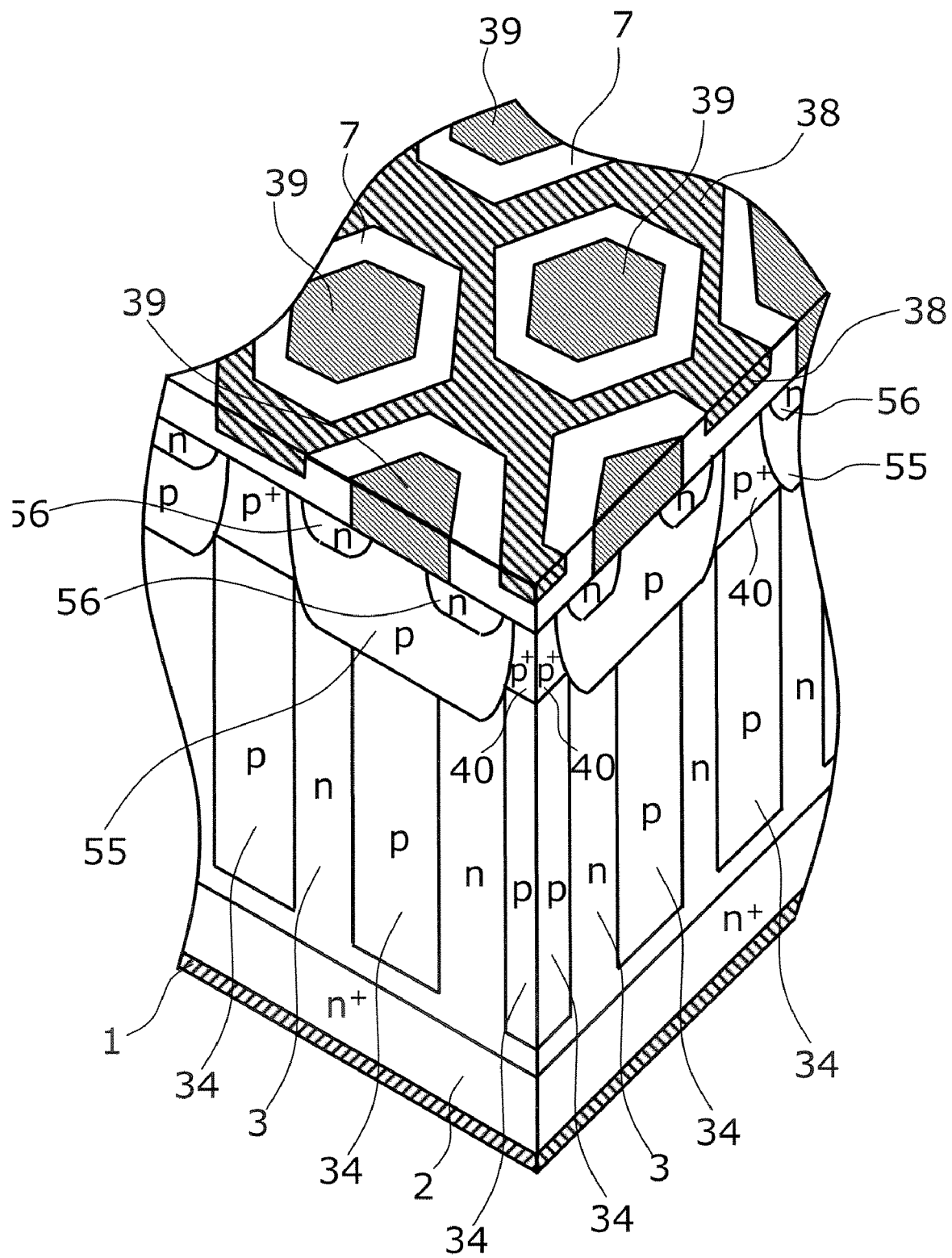
FIG. 9 is a schematic perspective view illustrating the cross-sectional and planar structure of the relevant part of a semiconductor device according to a sixth embodiment of the invention.

FIG. 9 is a schematic perspective view illustrating the cross-sectional and planar structure of the relevant part of a semiconductor device according to a sixth embodiment of the invention.

This embodiment is different from the fifth embodiment in that a p-type high-concentration region 40 having a higher impurity concentration than the p-type pillar region 34 is provided on the surface of the p-type pillar region 34 provided at the corner 55a of the base region 55 that is located below the crossing of the control electrode 38. This structure further alleviates electric field concentration onto the corner 55a of the base region 55 and facilitates achieving high breakdown voltage. Because there is no need to deplete the high-concentration region 40, the high-concentration region 40 and the base region 55 preferably have a comparable impurity concentration.

This structure can be obtained as described above with reference to FIG. 4. Specifically, the line width of the control electrode 38, which also serves as a mask for forming the base region 55, is decreased only at the crossing. Then ion implantation of p-type impurities is conducted. In a subsequent heat treatment step, the p-type impurities are diffused into the surface of the p-type pillar region 34, thereby completing the structure. Alternatively, the high-concentration region 40 may be formed by conducting ion implantation into the surface of the p-type pillar region 34 before forming the MOS structure.

Seventh Embodiment

Figure 10:
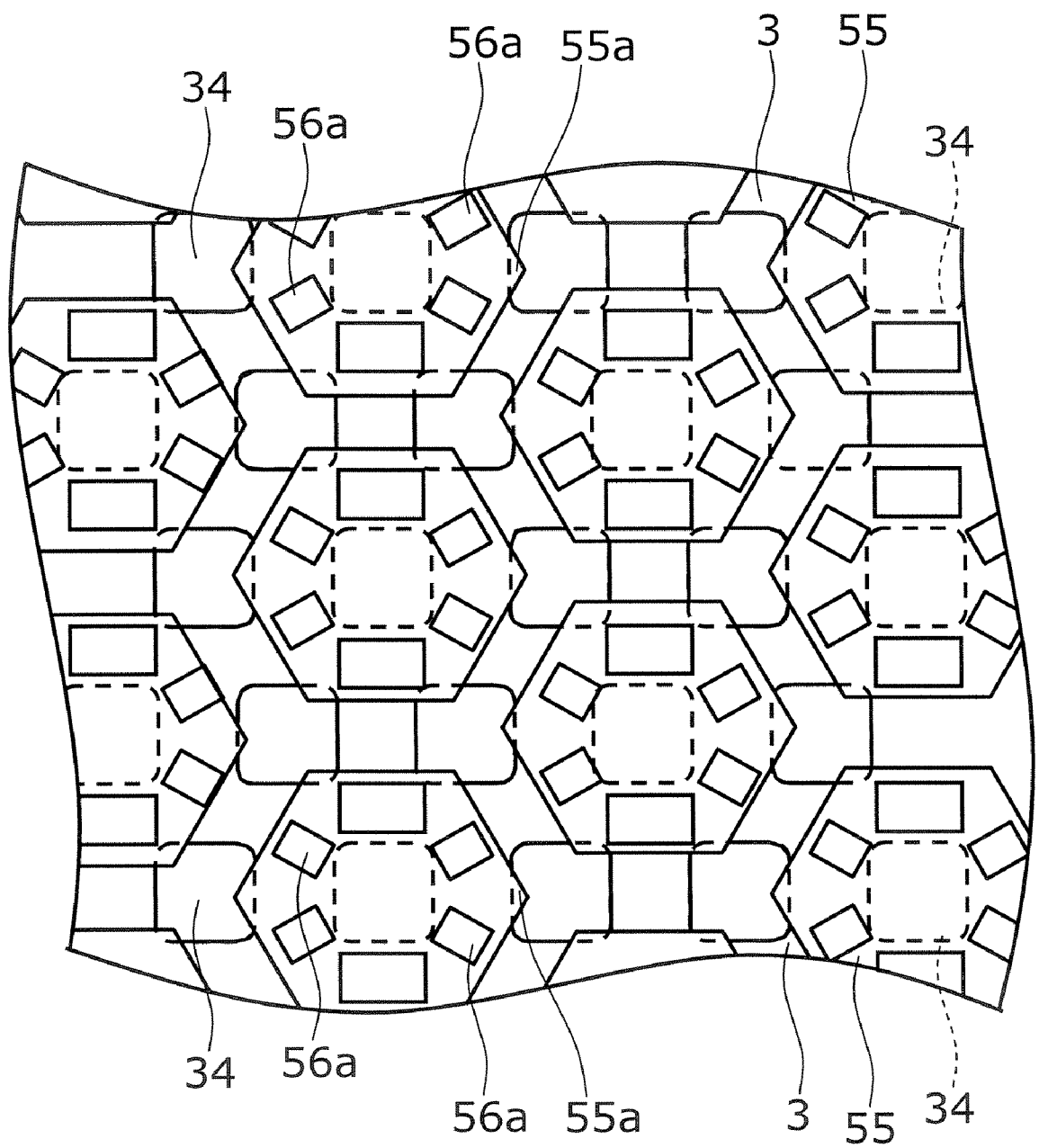
FIG. 10 is a schematic plan view illustrating a pattern of the source region in a semiconductor device according to a seventh embodiment of the invention.

FIG. 10 is a schematic plan view illustrating a pattern of the source region 56a in a semiconductor device according to a seventh embodiment of the invention.

In this embodiment, the source regions 56a are provided only at positions opposed to the six sides of the base region 55, and not provided at positions opposed to the corners 55a. Because a p-type pillar region 34 is provided in contact with a corner 55a of the base region 55, the corner 55a does not constitute the current path. Therefore the on-resistance is not changed even if no source region is provided at the corner 55a of the base region 55.

Thus the source region 56a is not formed at the corner 55a where electric field concentration is likely to occur and avalanche current is likely to flow. This prevents the operation of the parasite bipolar transistor composed of the source region 56a, the base region 55, and the n-type pillar region 3, thereby advantageously achieving high avalanche withstand capability.

Eighth Embodiment

Figure 11:
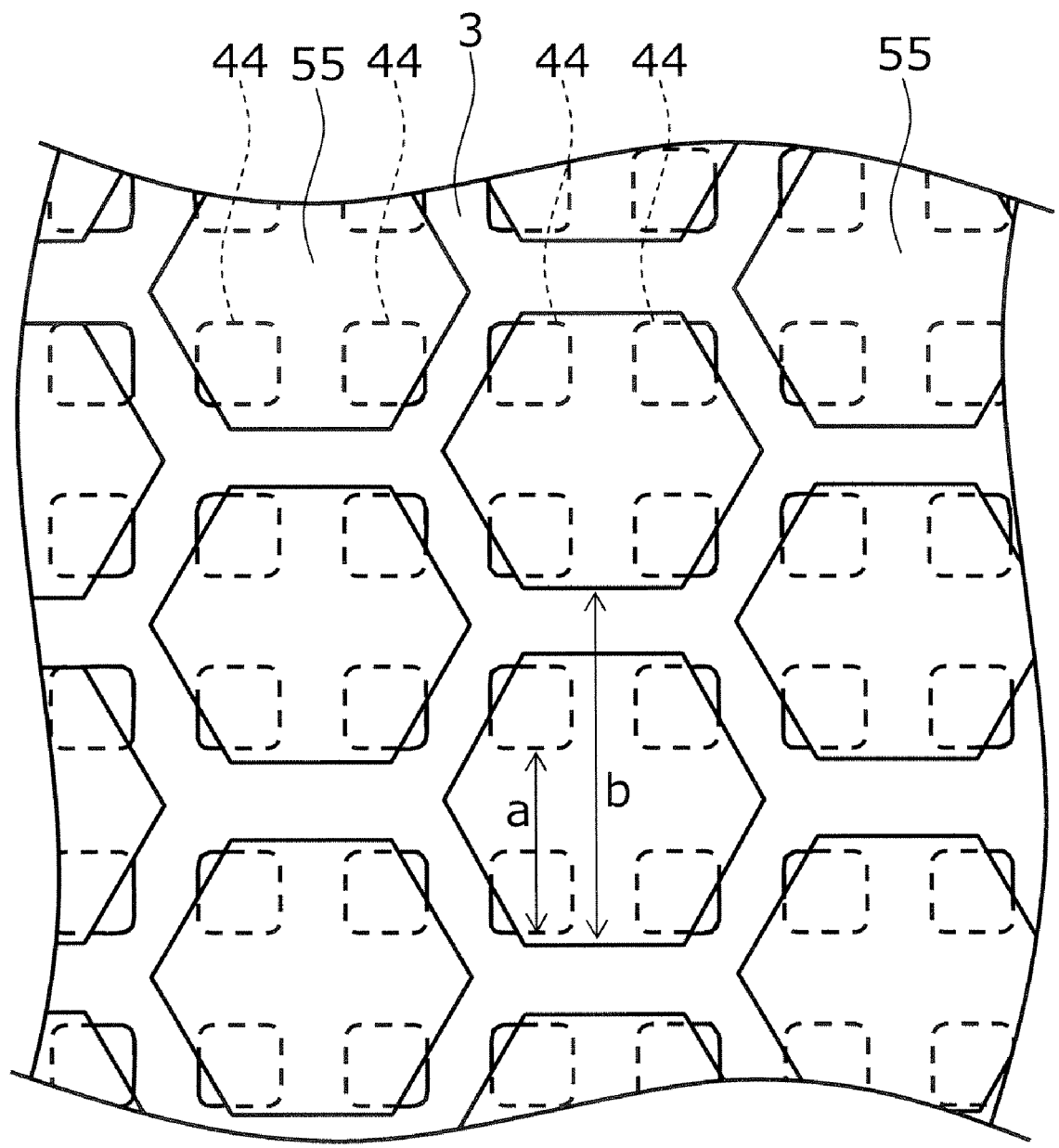
FIG. 11 is a schematic plan view illustrating the positional relationship between the base region and the p-type pillar region in a semiconductor device according to an eighth embodiment of the invention.

FIG. 11 is a schematic plan view illustrating the positional relationship between the base region 55 and the p-type pillar region 34 in a semiconductor device according to an eighth embodiment of the invention.

In this embodiment, like the fifth embodiment, hexagonal base regions 55 are provided. A control electrode 38 extending along the contour of the base region 55 has openings periodically provided in a first and second direction. Four p-type pillar regions 44 are provided below one base region 55.

The base regions 55 are periodically arranged at pitch b, and the p-type pillar regions 44 are periodically arranged at pitch a, which is half the pitch b. Therefore, as compared with the situation where the period of the superjunction structure equals the period b of the MOS gate structure, the period a of the superjunction structure is decreased by a factor of 2. As a result, the impurity concentration of the pillar region can be increased by a factor of 2, and the on-resistance can be decreased by a factor of 2.

Ninth Embodiment

Figure 12:
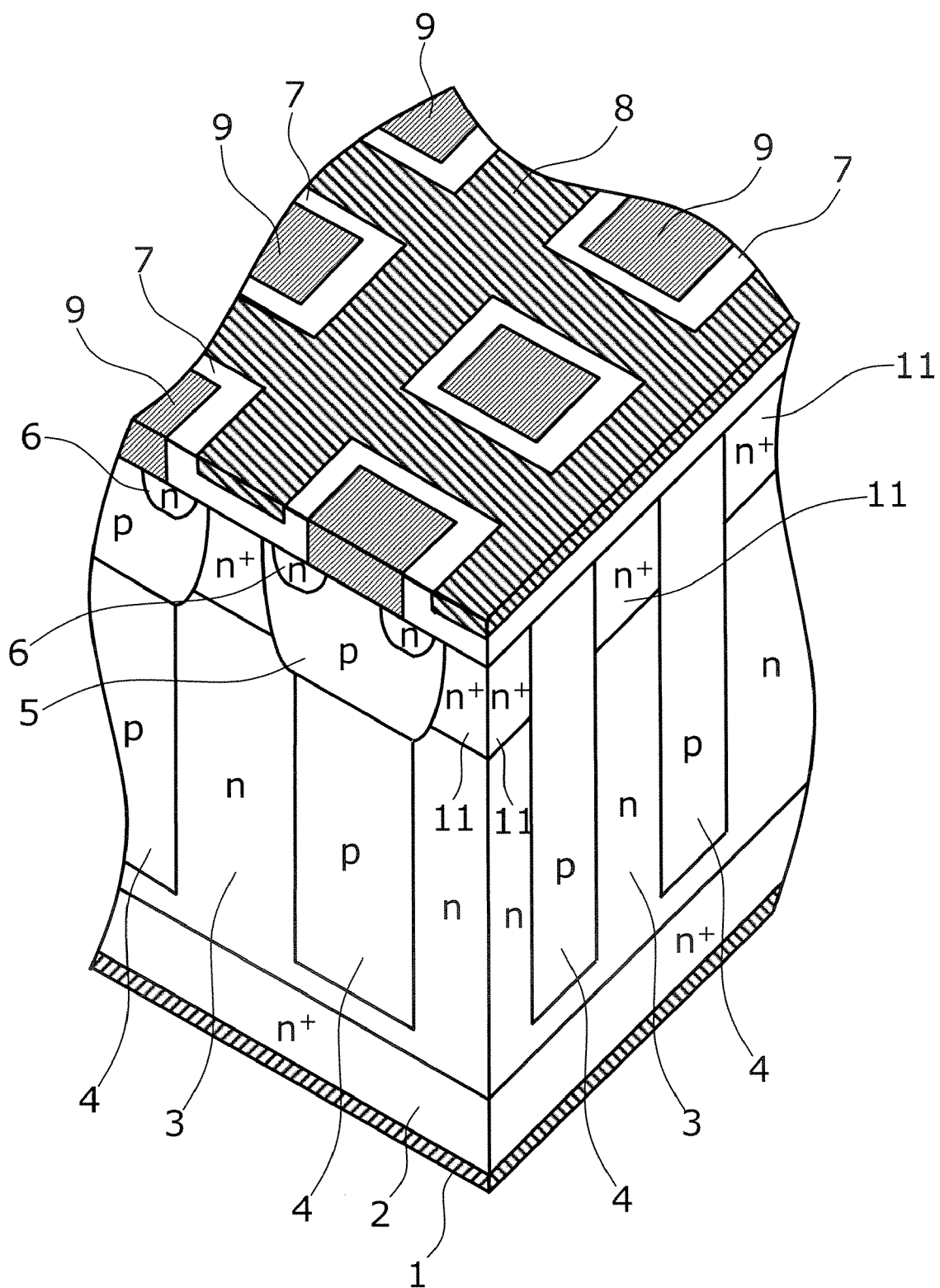
FIG. 12 is a schematic perspective view illustrating the cross-sectional and planar structure of the relevant part of a semiconductor device according to a ninth embodiment of the invention.

FIG. 12 is a schematic perspective view illustrating the cross-sectional and planar structure of the relevant part of a semiconductor device according to a ninth embodiment of the invention.

In this embodiment, a high-concentration region 11 having a higher n-type impurity concentration than the n-type pillar region 3 is provided on top of the n-type pillar region 3 adjacent to the base region 5. Thus the resistance of the current path extending from the channel to the n-type pillar region 3 can be decreased, and the on-resistance can be reduced.

Tenth Embodiment

Figure 13:
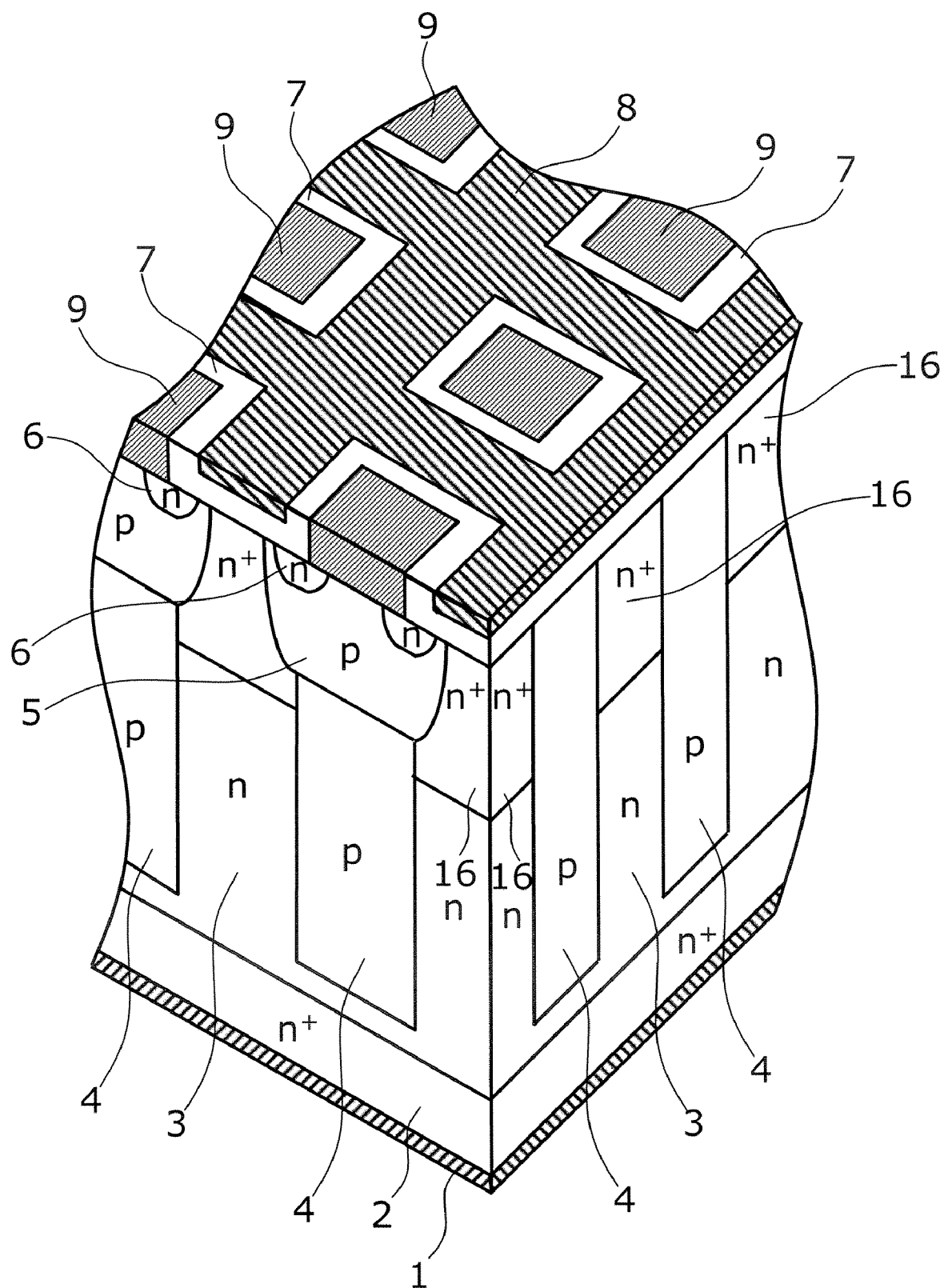
FIG. 13 is a schematic perspective view illustrating the cross-sectional and planar structure of the relevant part of a semiconductor device according to a tenth embodiment of the invention.

FIG. 13 is a schematic perspective view illustrating the cross-sectional and planar structure of the relevant part of a semiconductor device according to a tenth embodiment of the invention.

In this embodiment again, like the ninth embodiment, a high-concentration region 16 having a higher n-type impurity concentration than the n-type pillar region 3 is provided on top of the n-type pillar region 3 adjacent to the base region 5. Moreover, the depth of the high-concentration region 16 is made deeper than the base region 5. Thus the spreading resistance for carriers below the base region 5 can be decreased.

Eleventh Embodiment

Figure 14:
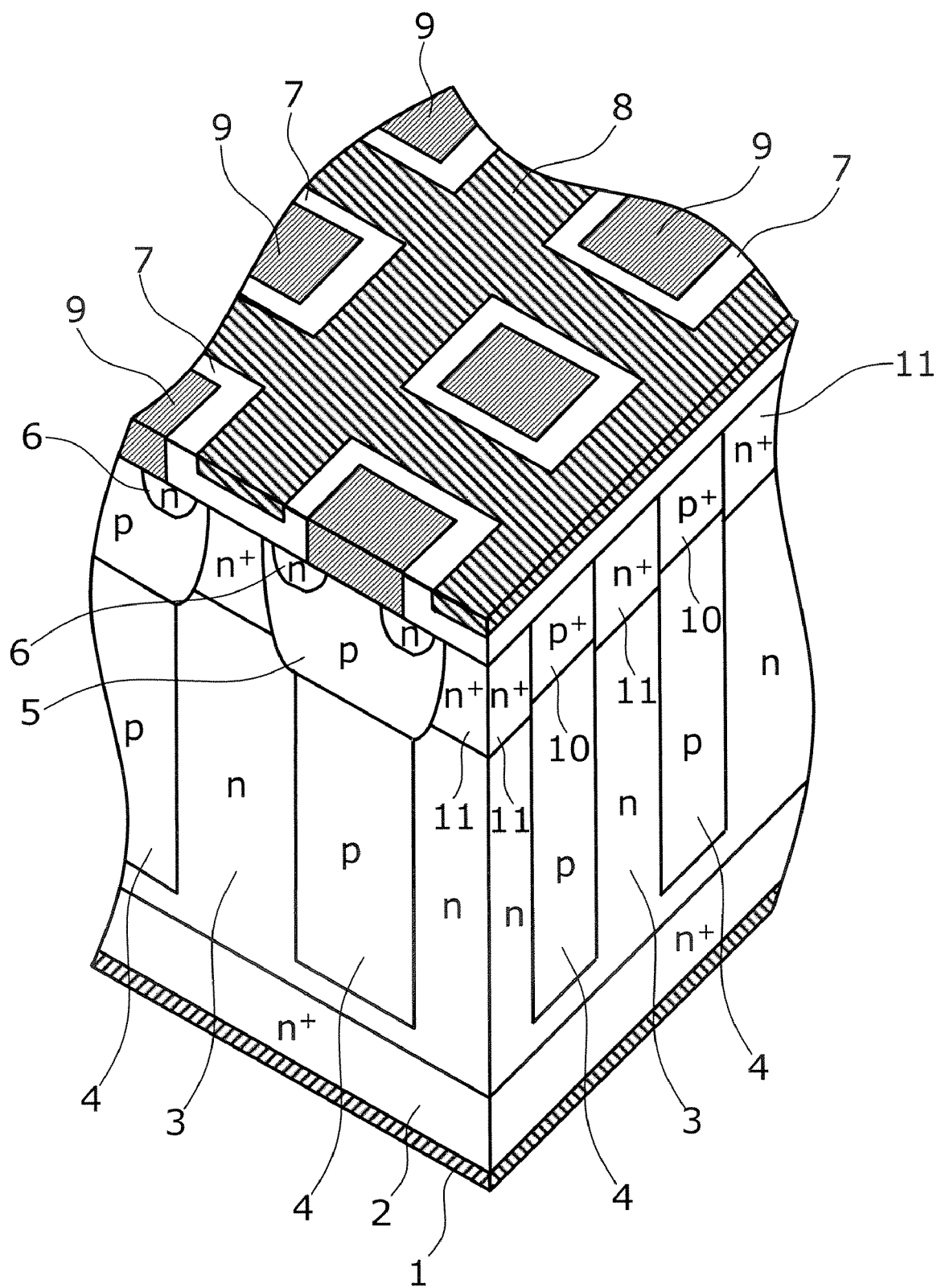
FIG. 14 is a schematic perspective view illustrating the cross-sectional and planar structure of the relevant part of a semiconductor device according to an eleventh embodiment of the invention.

FIG. 14 is a schematic perspective view illustrating the cross-sectional and planar structure of the relevant part of a semiconductor device according to an eleventh embodiment of the invention.

In this embodiment, a p-type high-concentration region 10 having a higher impurity concentration than the p-type pillar region 4 is provided on the surface of the p-type pillar region 4 provided at the corner 5a of the base region 5 that is located below the crossing of the control electrode 8, thereby alleviating electric field concentration onto the corner 5a of the base region 5 and facilitating high breakdown voltage. At the same time, a high-concentration region 11 having a higher n-type impurity concentration than the n-type pillar region 3 is provided on top of the n-type pillar region 3 adjacent to the base region 5, thereby reducing on-resistance.

Twelfth Embodiment

Figure 15:
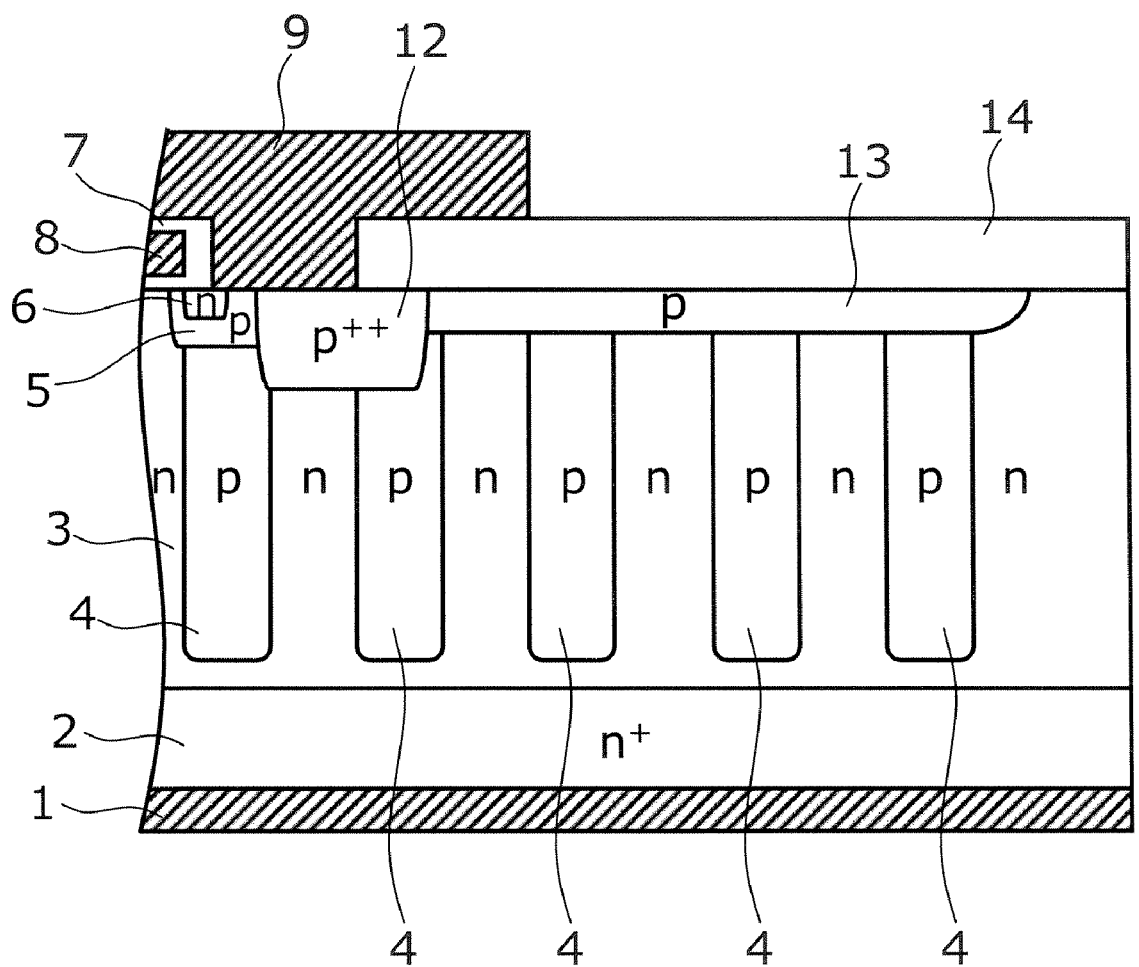
FIG. 15 is a schematic cross section illustrating the cross-sectional structure of the relevant part of a semiconductor device according to a twelfth embodiment of the invention.

FIG. 15 is a schematic cross section illustrating the cross-sectional structure of the relevant part of a semiconductor device according to a twelfth embodiment of the invention.

By shallowing the base region 5, the MOS gate structure can be downsized. However, when the base region 5 is shallowed, strong electric field is likely to act particularly on the edge of the base region 5 at the device end portion, and the breakdown voltage is decreased. In contrast, in this embodiment, a guard ring 12 deeper than the base region 5 is formed at the device end portion to reduce electric field concentration onto the edge of the base region. Thus high breakdown voltage can be maintained.

Because the guard ring 12 provided at the device end portion does not affect the gate threshold voltage, there is no restriction on the impurity concentration of the guard ring 12. However, for the purpose of rapidly releasing holes generated by avalanche breakdown, the guard ring 12 preferably has a higher impurity concentration than the base region 5.

This embodiment is based on the termination structure at the device end portion having a p-type RESURF (Reduced Surface Field) 13 outside the guard ring 12. However, the termination structure is not limited thereto, but may be other termination structures such as the field plate structure and the guard ring structure. Furthermore, because the planar pattern of the superjunction structure and the MOS gate structure does not depend on the termination structure, the structure of the device portion can be based on any of the embodiments described above.

In this embodiment, the superjunction structure is provided also at the device end portion. However, instead of the superjunction structure, it is possible to provide a high resistance layer, or an $n^-$-type region having a lower impurity concentration than the n-type pillar region 3. Furthermore, because the superjunction structure at the device end portion does not affect the on-resistance, it may have a lower impurity concentration or a smaller period. By decreasing the impurity concentration or the period of the superjunction structure at the device end portion, the breakdown voltage at the end portion is increased, thereby facilitating high breakdown voltage.

Thirteenth Embodiment

Figure 16:
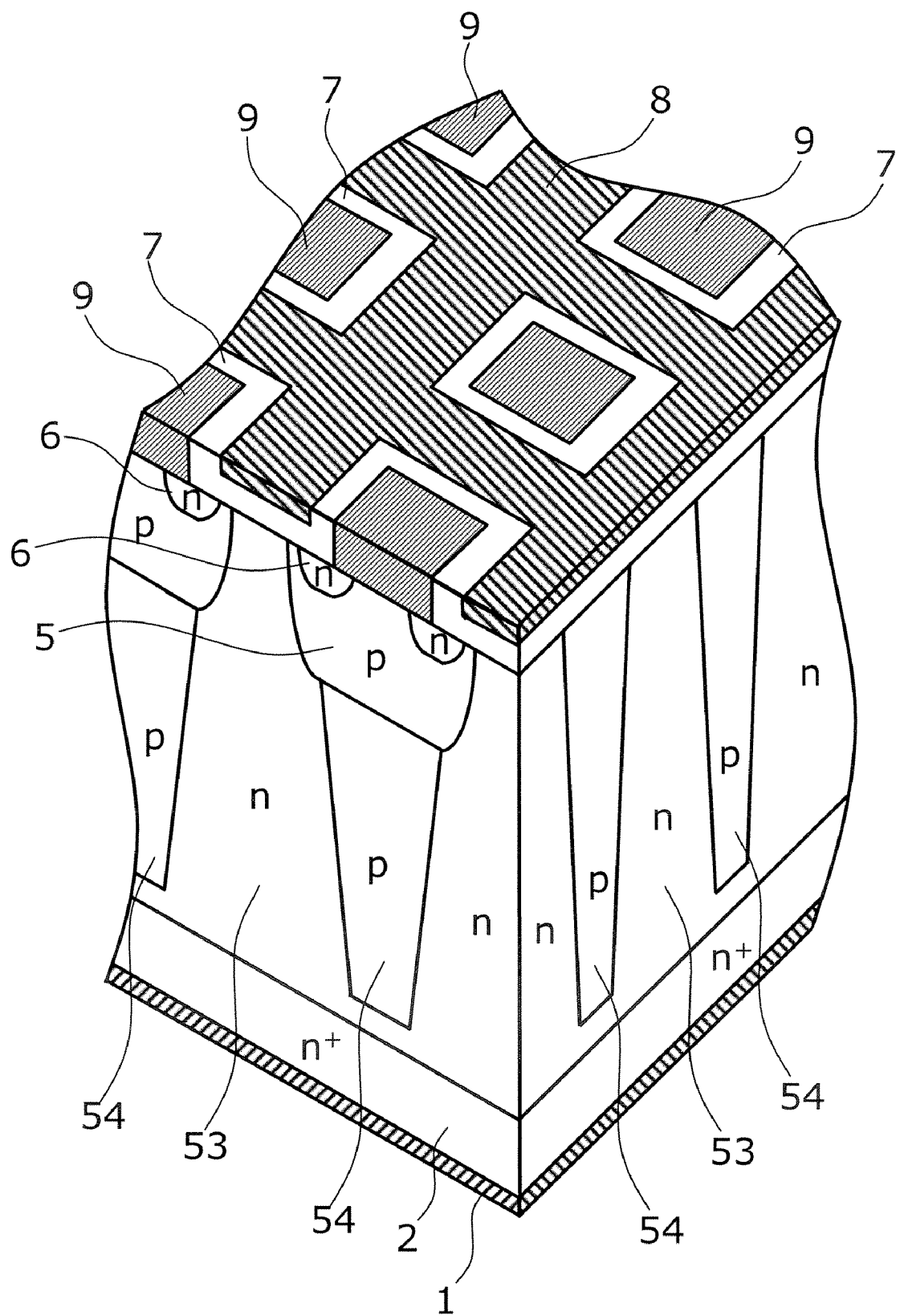
FIG. 16 is a schematic perspective view illustrating the cross-sectional and planar structure of the relevant part of a semiconductor device according to a thirteenth embodiment of the invention.

FIG. 16 is a schematic perspective view illustrating the cross-sectional and planar structure of the relevant part of a semiconductor device according to a thirteenth embodiment of the invention In this embodiment, the amount of impurities in the p-type pillar region 54 is not vertically uniform, but gradually decreased in the direction from the source electrode 9 to the drain electrode 1. The amount of impurities used herein refers to the amount of impurities contained in the pillar region and equals the product of the impurity concentration [$cm^{-3}$] and the cross-sectional area of the pillar region [$cm^2$]. Therefore the structure of this embodiment can be obtained by decreasing at least one of the impurity concentration and the cross-sectional area of the p-type pillar region 54 in the direction from the source electrode 9 to the drain electrode 1.

Such pillar profile, where the amount of impurities is gradually varied in the direction from the source electrode 9 to the drain electrode 1, can reduce the variation of breakdown voltage when the amount of pillar impurities is varied. Furthermore, avalanche breakdown is likely to occur at the center of the superjunction structure, thereby achieving high avalanche withstand capability. The variation of the amount of impurities is preferably such that the concentration in the upper portion of the pillar region is 1.2 to 2.3 times the concentration in the lower portion.

When the superjunction structure is formed by repeating ion implantation and buried crystal growth, the above profile of the amount of impurities can be realized by varying the dose of ion implantation. When the superjunction structure is formed by forming a trench and then burying the trench by crystal growth, the above profile can be realized by forming the trench in a tapered configuration rather than in a straight configuration.

While the amount of impurities in the p-type pillar region 54 is varied in this embodiment, it is also possible to gradually increase the amount of impurities in the n-type pillar region 53 in the direction from the source electrode 9 to the drain electrode 1. Furthermore, the amount of impurities may be varied in both of the p-type pillar region 54 and the n-type pillar region 53.

Fourteenth Embodiment

Figure 17:
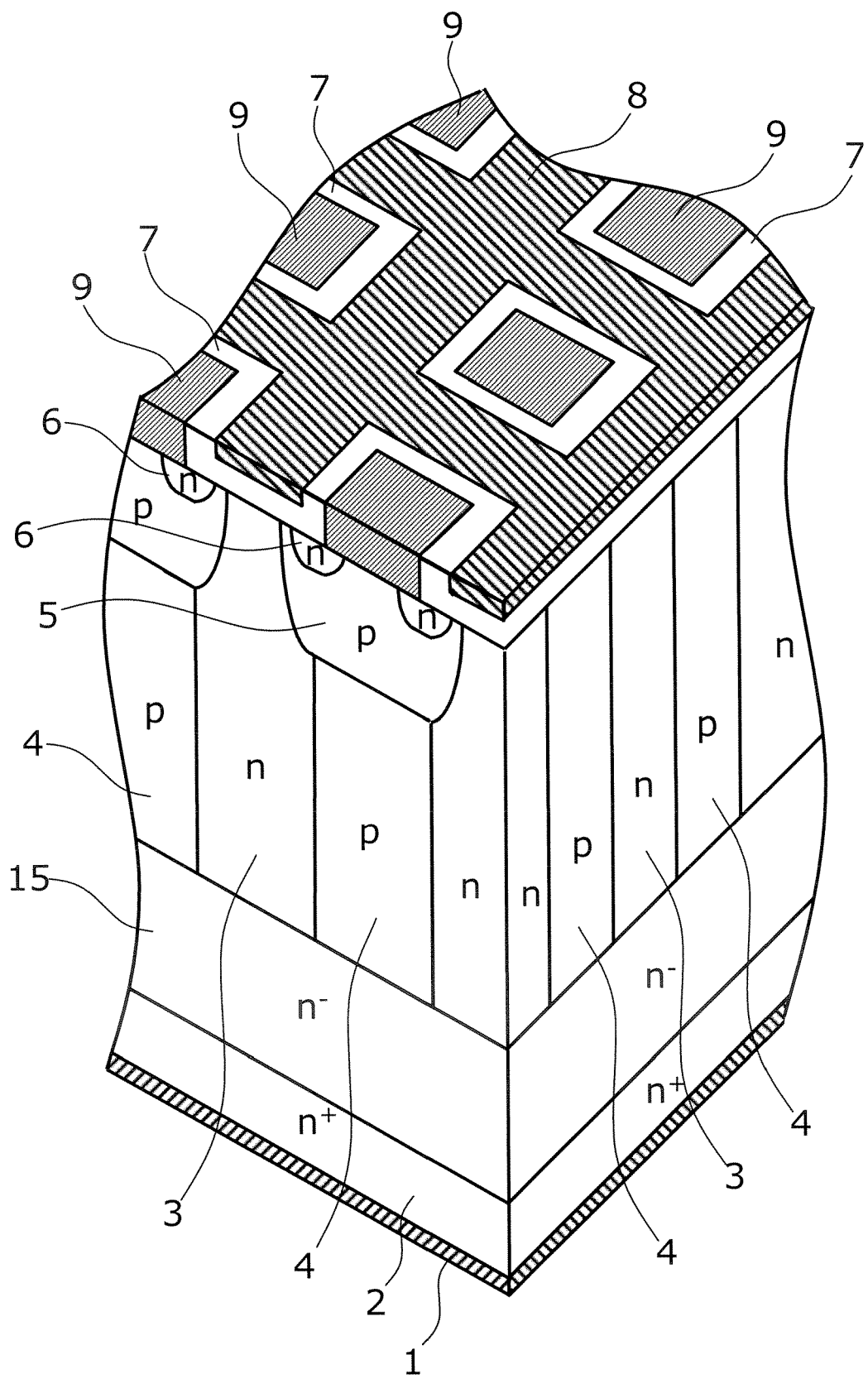
FIG. 17 is a schematic perspective view illustrating the cross-sectional and planar structure of the relevant part of a semiconductor device according to a fourteenth embodiment of the invention.

FIG. 17 is a schematic perspective view illustrating the cross-sectional and planar structure of the relevant part of a semiconductor device according to a fourteenth embodiment of the invention.

In this embodiment, an n⁻-type semiconductor layer 15 having a lower impurity concentration than the n-type pillar region 3 is provided between the superjunction structure and the n⁺-type drain layer 2. This semiconductor layer 15 makes the device breakdown voltage equal to the sum of the breakdown voltage of the superjunction structure and the breakdown voltage of the semiconductor layer 15. Thus the breakdown voltage can be further increased.

Embodiments of the invention have been described with reference to specific examples. However, the invention is not limited thereto, but the embodiments can be variously modified within the spirit of the invention.

In the structures described above, the conductivity type of each element can be reversed.

The planar configuration of the base region, the layout of the base regions and the pillar regions of the second conductivity type, and the planar pattern of the control electrode may be other than those described in the above embodiments.

Semiconductor is not limited to silicon. For example, compound semiconductors (such as silicon carbide and gallium nitride) or wide bandgap semiconductors such as diamond can be used.

The invention is not limited to application to MOSFET devices, but can be applied to hybrid devices of MOSFETs and SBDs (Schottky barrier diodes) or to IGBTs (Insulated Gate Bipolar Transistors).

The invention claimed is:

1. A semiconductor device comprising:
  a semiconductor layer of a first conductivity type;
  a plurality of first cylindrical semiconductor pillar regions of the first conductivity type periodically provided on a major surface of the semiconductor layer;
  a plurality of second cylindrical semiconductor pillar regions of a second conductivity type provided on the major surface of the semiconductor layer and being adjacent to the first semiconductor pillar regions;
  a plurality of first semiconductor regions of the second conductivity type provided in contact with the top of the second semiconductor pillar regions;
  second semiconductor regions of the first conductivity type selectively provided on the surface of the first semiconductor regions;
  a first main electrode provided on the first semiconductor region and the second semiconductor region;
  an insulating film provided on the first semiconductor pillar regions, the first semiconductor regions, and the second semiconductor regions;
  a control electrode provided on the insulating film; and
  a second main electrode provided on a side opposite to the major surface of the semiconductor layer,
  the control electrode having openings periodically provided in first and second directions substantially parallel to the insulating film,
  each of the first semiconductor regions being provided below the opening of the control electrode, and
  a period of arrangement of the plurality of second cylindrical semiconductor pillar regions being smaller than the periods of the openings in the first and second directions.

2. A semiconductor device according to claim 1, wherein a plurality of the second semiconductor pillar regions are in contact with each of the first semiconductor regions, and at least one of the second semiconductor pillar regions is provided directly below the first semiconductor region.

3. A semiconductor device according to claim 2, wherein the second semiconductor pillar region is also provided below corners of the first semiconductor region in addition to directly below the first semiconductor region.

4. A semiconductor device according to claim 3, wherein the second semiconductor regions are provided at other than the corners of the first semiconductor region.

5. A semiconductor device according to claim 3, wherein a high-concentration region of the second conductivity type having a higher impurity concentration than the second semiconductor pillar region is provided on a surface of the second semiconductor pillar region provided at the corner of the first semiconductor region.

6. A semiconductor device according to claim 3, wherein the first semiconductor regions are formed in a rectangular or hexagonal configuration.

7. A semiconductor device according to claim 1, wherein the first semiconductor regions are formed in a hexagonal configuration, and a high-concentration region of the second conductivity type having a higher impurity concentration than the second semiconductor pillar region is provided on a surface of the second semiconductor pillar region provided at the corner of the first semiconductor region.

8. A semiconductor device according to claim 1, wherein the period of arrangement of the plurality of second cylindrical semiconductor pillar regions is $1/\sqrt{2}$ times the period of the openings in at least one of the first and second directions.

9. A semiconductor device according to claim 1, wherein the period of arrangement of the plurality of second cylindrical semiconductor pillar regions is $1/\sqrt{3}$ times the period of the openings in at least one of the first and second directions.

10. A semiconductor device according to claim 1, wherein the first semiconductor regions are formed in a hexagonal configuration, and the period of the openings in at least one of the first and second directions is 2 times the period of arrangement of the plurality of second cylindrical semiconductor pillar regions.

11. A semiconductor device comprising:
  a semiconductor layer of a first conductivity type;
  a plurality of first cylindrical semiconductor pillar regions of the first conductivity type periodically provided on a major surface of the semiconductor layer;
  a plurality of second cylindrical semiconductor pillar regions of a second conductivity type provided on the major surface of the semiconductor layer and being adjacent to the first semiconductor pillar regions;
  a plurality of first semiconductor regions of the second conductivity type provided in contact with the top of the second semiconductor pillar regions;
  second semiconductor regions of the first conductivity type selectively provided on the surface of the first semiconductor regions;
  a first main electrode provided on the first semiconductor region and the second semiconductor region;
  an insulating film provided on the first semiconductor pillar regions, the first semiconductor regions, and the second semiconductor regions;
  a control electrode provided on the insulating film; and a second main electrode provided on a side opposite to the major surface of the semiconductor layer, the first semiconductor regions being periodically provided in first and second directions substantially parallel to the insulating film, and a period of arrangement of the plurality of second cylindrical semiconductor pillar regions being smaller than the periods of the first semiconductor regions in the first and second directions.

12. A semiconductor device according to claim 11, wherein a plurality of the second semiconductor pillar regions are in contact with each of the first semiconductor regions, and at least one of the second semiconductor pillar regions is provided directly below the first semiconductor region.

13. A semiconductor device according to claim 12, wherein the second semiconductor pillar region is also provided below corners of the first semiconductor region in addition to directly below the first semiconductor region.

14. A semiconductor device according to claim 13, wherein a high-concentration region of the second conductivity type having a higher impurity concentration than the second semiconductor pillar region is provided on a surface of the second semiconductor pillar region provided at the corner of the first semiconductor region.

15. A semiconductor device according to claim 11, wherein a high-concentration region of the first conductivity type having a higher impurity concentration than the first semiconductor pillar regions is provided on a surface of the first semiconductor pillar regions.

16. A semiconductor device according to claim 11, wherein a third semiconductor region of the second conductivity type having a depth greater than the first semiconductor region is provided at a device end portion.

17. A semiconductor device according to claim 16, wherein an impurity concentration of the third semiconductor region is higher than an impurity concentration of the first semiconductor region.

18. A semiconductor device according to claim 11, wherein an amount of impurity of the first semiconductor pillar region increases from the first main electrode toward the second main electrode.

19. A semiconductor device according to claim 11, wherein an amount of impurity of the second semiconductor pillar region increases from the second main electrode toward the first main electrode.

20. A semiconductor device according to claim 11, wherein a second semiconductor layer of the first conductivity type having an impurity concentration lower than the first semiconductor pillar region is provided between the first and second semiconductor pillar regions, and the first semiconductor layer.

* * * * *